(12) United States Patent
Goodwin et al.

(10) Patent No.: US 11,171,146 B2
(45) Date of Patent: Nov. 9, 2021

(54) MEMORY DEVICES AND METHODS OF FORMING MEMORY DEVICES

(71) Applicant: Micron Technology, Inc., Boise, ID (US)

(72) Inventors: Robert B. Goodwin, Eagle, ID (US); Sanh D. Tang, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 157 days.

(21) Appl. No.: 16/711,884

(22) Filed: Dec. 12, 2019

(65) Prior Publication Data
US 2021/0183873 A1    Jun. 17, 2021

(51) Int. Cl.
| | |
|---|---|
| H01L 27/11514 | (2017.01) |
| H01L 27/108 | (2006.01) |
| H01L 27/11504 | (2017.01) |
| H01L 27/11507 | (2017.01) |
| H01L 27/11509 | (2017.01) |
| G11C 11/22 | (2006.01) |

(52) U.S. Cl.
CPC ...... *H01L 27/11514* (2013.01); *G11C 11/221* (2013.01); *H01L 27/10808* (2013.01); *H01L 27/10855* (2013.01); *H01L 27/10873* (2013.01); *H01L 27/10897* (2013.01); *H01L 27/11504* (2013.01); *H01L 27/11507* (2013.01); *H01L 27/11509* (2013.01)

(58) Field of Classification Search
CPC ......... H01L 27/11514; H01L 27/10808; H01L 27/10855; H01L 27/10873; H01L 27/10897; H01L 27/11504; H01L 27/11507; H01L 27/11509; G11C 11/221
USPC ........................................................ 257/295
See application file for complete search history.

(56) References Cited

U.S. PATENT DOCUMENTS

| | | | |
|---|---|---|---|
| 10,141,048 B1 * | 11/2018 | Leobandung | ... H01L 21/823475 |
| 10,312,241 B1 | 6/2019 | Yokoyama | |
| 2018/0195049 A1 * | 7/2018 | Ramaswamy | .... H01L 27/10873 |
| 2020/0235111 A1 * | 7/2020 | Calderoni | ............... H01L 28/55 |

* cited by examiner

*Primary Examiner* — David Vu
*Assistant Examiner* — Brandon C Fox
(74) *Attorney, Agent, or Firm* — Wells St. John P.S.

(57) ABSTRACT

Some embodiments include an integrated assembly having bottom electrodes coupled with electrical nodes. Each of the bottom electrodes has a first leg electrically coupled with an associated one of the electrical nodes, and has a second leg joining to the first leg. First gaps are between some of the bottom electrodes, and second gaps are between others of the bottom electrodes. The first gaps alternate with the second gaps. Insulative material and conductive-plate-material are within the first gaps. Scaffold structures are within the second gaps and not within the first gaps. Capacitors include the bottom electrodes, regions of the insulative material and regions of the conductive-plate-material. The capacitors may be ferroelectric capacitors or non-ferroelectric capacitors. Some embodiments include methods of forming integrated assemblies.

31 Claims, 39 Drawing Sheets

MEMORY DEVICES AND METHODS OF FORMING MEMORY DEVICES

TECHNICAL FIELD

Memory devices (e.g., memory arrays comprising random-access memory), and methods of forming memory devices.

BACKGROUND

Dynamic random-access memory (DRAM) may utilize memory cells which individually comprise an access transistor in combination with a capacitor.

Ferroelectric random-access memory (FeRAM) may be configured similarly to DRAM, except that the FeRAM utilizes ferroelectric capacitors instead of the non-ferroelectric capacitors of conventional DRAM.

It would be desirable to develop improved memory architecture, and improved methods of forming memory architecture. It would also be desirable for such methods to be applicable for fabrication of both DRAM and FeRAM.

BRIEF DESCRIPTION OF THE DRAWINGS

FIG. 1 is a top view. FIGS. 1A and 1B are cross-sectional side views along the lines A-A and B-B, respectively, of FIG. 1.

FIG. 2 is a top view. FIGS. 2A and 2B are cross-sectional side views along the lines A-A and B-B, respectively, of FIG. 2.

FIG. 3 is a top view. FIGS. 3A and 3B are cross-sectional side views along the lines A-A and B-B, respectively, of FIG. 3.

FIG. 4 is a top view. FIGS. 4A and 4B are cross-sectional side views along the lines A-A and B-B, respectively, of FIG. 4.

FIG. 5 is a top view. FIGS. 5A and 5B are cross-sectional side views along the lines A-A and B-B, respectively, of FIG. 5.

FIG. 6 is a top view. FIGS. 6A and 6B are cross-sectional side views along the lines A-A and B-B, respectively, of FIG. 6.

FIG. 7 is a top view. FIGS. 7A and 7B are cross-sectional side views along the lines A-A and B-B, respectively, of FIG. 7.

FIG. 8 is a top view. FIGS. 8A and 8B are cross-sectional side views along the lines A-A and B-B, respectively, of FIG. 8.

FIG. 9 is a top view. FIG. 9C is a three-dimensional view.

FIG. 10 is a top view.

FIG. 10D is a three-dimensional view.

DETAILED DESCRIPTION OF THE ILLUSTRATED EMBODIMENTS

Some embodiments include methods of forming vertically-elongated capacitors having storage nodes (bottom electrodes) supported by vertically-stacked scaffold structures. Some embodiments include integrated assemblies (e.g., memory architectures) having capacitor storage nodes which are supported by vertically-stacked scaffold structures. Example embodiments are described with reference to FIGS. 1-16.

Figure 1:
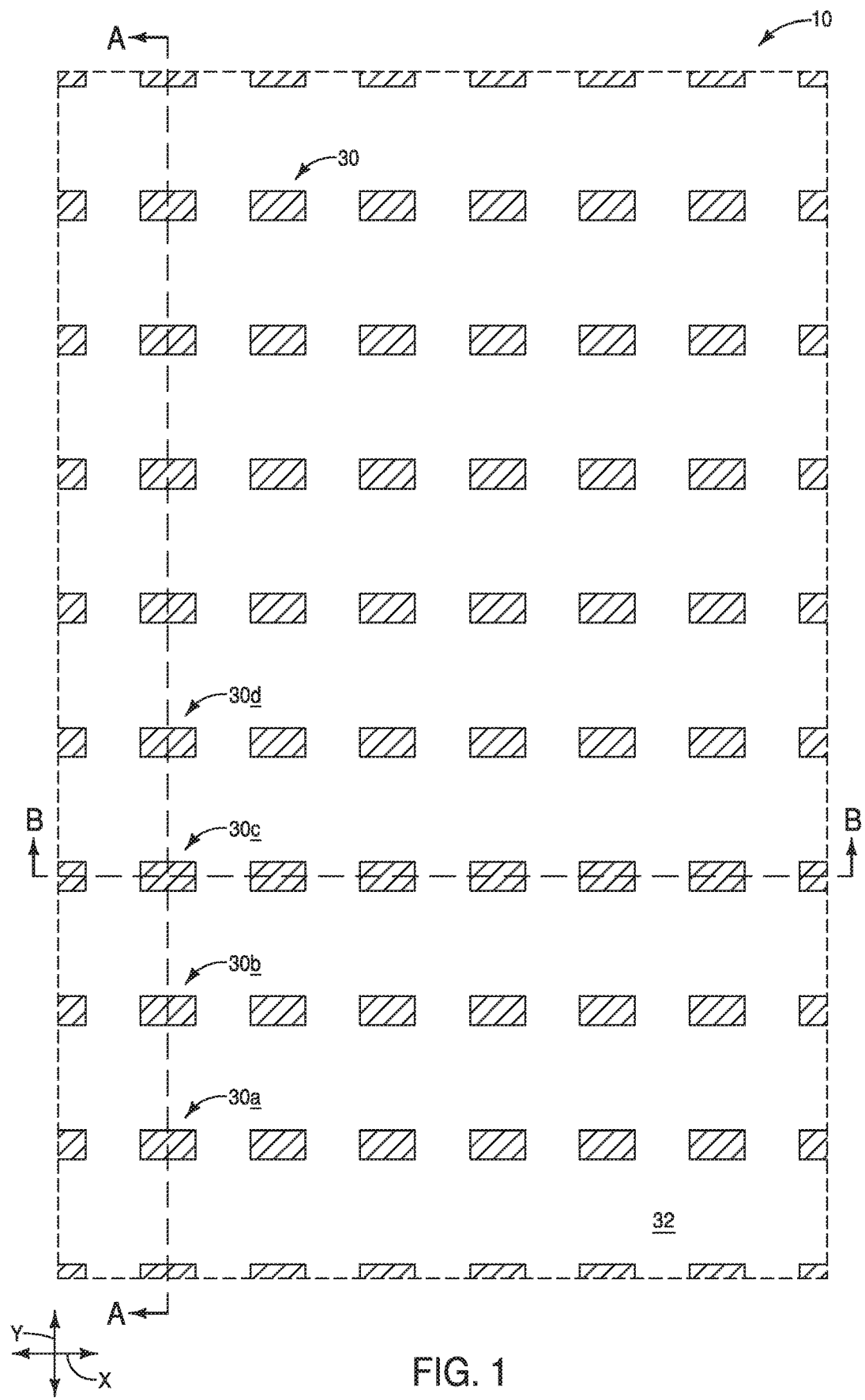
FIGS. 1-1B are diagrammatic views of a region of an example construction at an example process stage of an example method for forming an example integrated assembly.
Figure 1A:
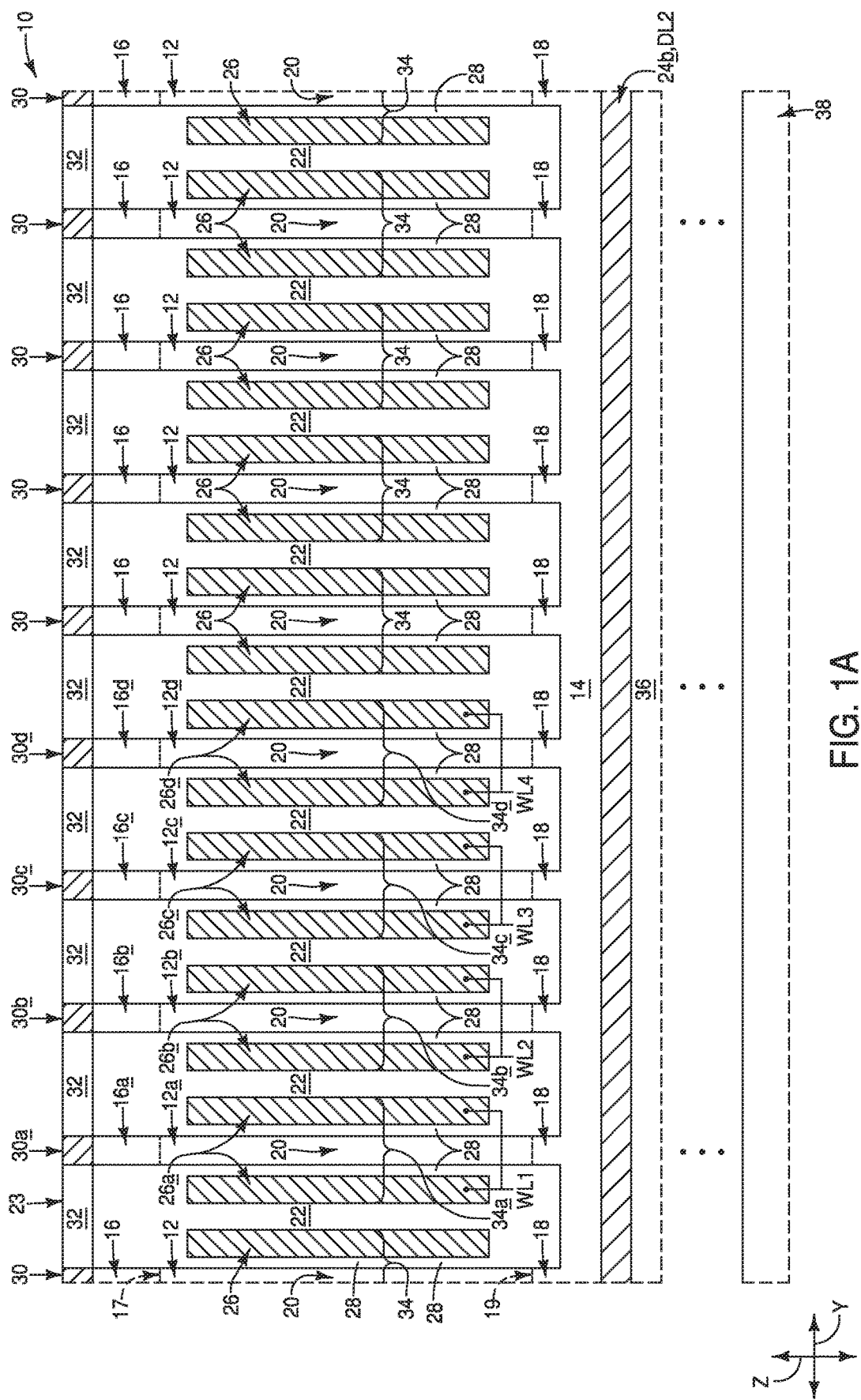
Figure 1B:
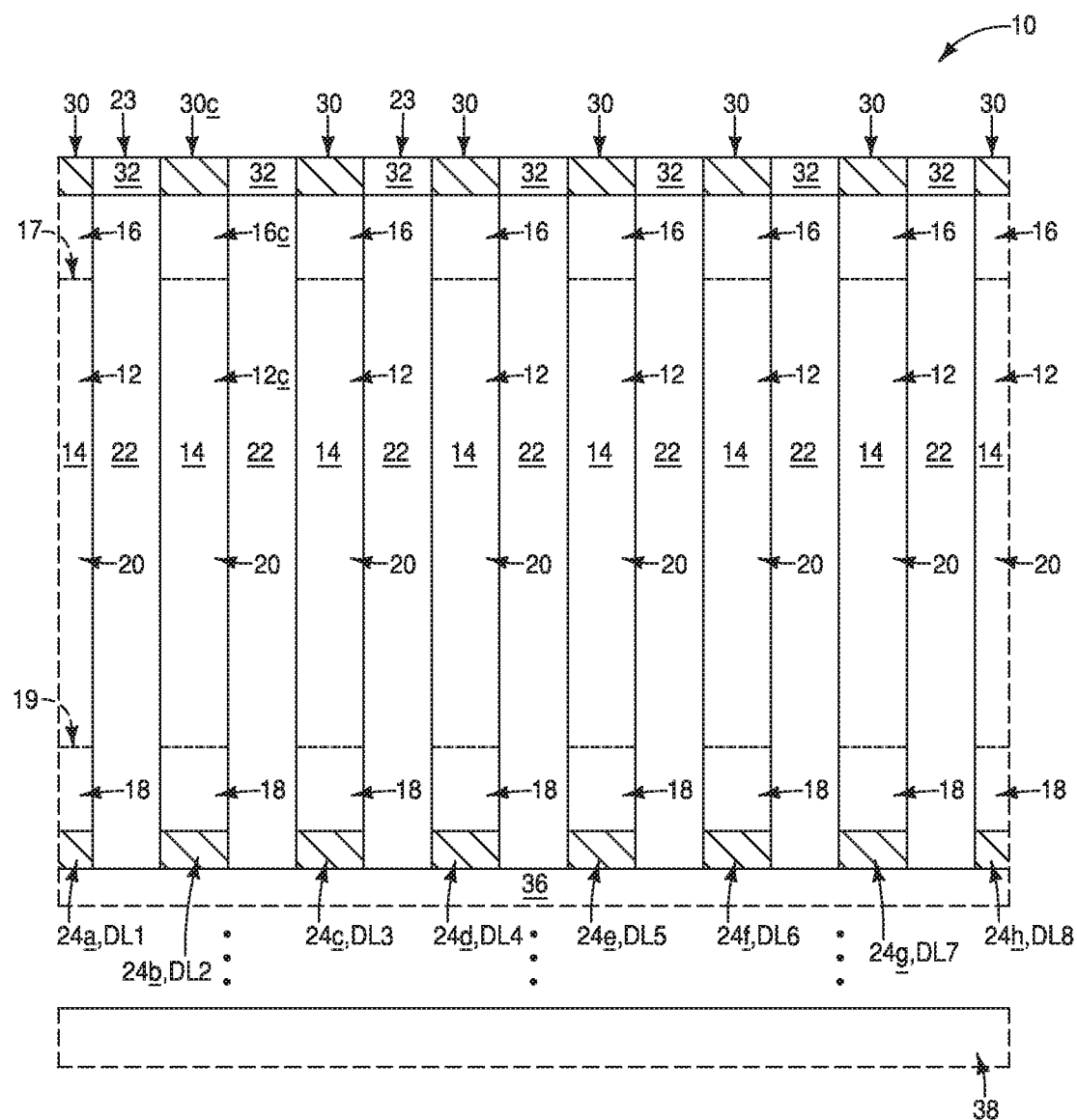

Referring to FIGS. 1-1B, an integrated assembly (construction, architecture) 10 includes vertically-extending pillars 12. The pillars 12 comprise semiconductor material 14. The pillars 12 are all substantially identical to one another, with the term "substantially identical" meaning identical to within reasonable tolerances of fabrication and measurement.

The semiconductor material 14 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 14 may comprise, consist essentially of, or consist of appropriately-doped silicon. The silicon may be in any suitable form, and in some embodiments may be monocrystalline, polycrystalline and/or amorphous.

Each of the pillars 12 includes a channel region 20 between an upper source/drain region 16 and a lower source/drain region 18. Dashed lines 17 and 19 are utilized to indicate approximate boundaries between the channel regions 20 and the source/drain regions 16 and 18.

The source/drain regions 16 and 18 are heavily doped (e.g., doped to a concentration of at least about $10^{20}$ atoms/cm$^3$ with conductivity-enhancing dopant). In some embodiments, the source/drain regions 16 and 18 may be n-type doped by incorporating one or both of phosphorus and arsenic into the semiconductor material (e.g., silicon) 14 of the pillars 12.

In the illustrated embodiment, the channel regions extend vertically (i.e., extend along the illustrated z-axis). In other embodiments, the channel regions may extend in other directions. The channel regions may be doped to any suitable concentration with any suitable dopant(s), and in some embodiments may be doped to a concentration of less than or equal to about $10^{18}$ atoms/cm$^3$ with p-type dopant (e.g., boron).

In the shown embodiment, four of the pillars are labeled as 12a, 12b, 12c and 12d so that they may be distinguished from one another, and from the other pillars. The pillars 12a, 12b, 12c and 12d may be referred to as first, second, third and fourth pillars, respectively; and extend in lateral order along the cross-section of FIG. 1A. The upper source/drain regions 16 associated with the pillars 12a-d are labeled as 16a-d; and may be referred to as first, second, third and fourth upper source/drain regions, respectively.

Insulative material 22 extends between the pillars 12. The insulative material 22 may comprise any suitable composition(s); and in some embodiments may comprise, consist essentially of, or consist of one or more of silicon dioxide, silicon nitride, aluminum oxide, hafnium oxide, zirconium oxide, etc.

The construction 10 includes digit lines 24 under the pillars 12. The digit lines are electrically coupled with the lower source/drain regions 18 of the pillars. The digit lines are labeled as 24a-h (DL1-DL8) so that they may be distinguished from one another. The digit lines may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

In the illustrated embodiment, the digit lines are physically against the lower source/drain regions 18. In some embodiments, the digit lines may comprise metal (e.g., titanium, tungsten, etc.), the source/drain regions 18 may comprise conductively-doped silicon, and metal silicide be present where the silicon of the source/drain regions 18 interfaces with the digit lines 24.

Wordlines 26 are alongside the pillars 12, and are spaced from the pillars by dielectric material (also referred to as gate dielectric material) 28.

The wordlines may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The dielectric material 28 may comprise any suitable composition(s); and in some embodiments may comprise, consist essentially of, or consist of one or more of silicon nitride, silicon dioxide, aluminum oxide, hafnium oxide, zirconium oxide, etc. The dielectric material 28 is shown merging with the dielectric material 22. The dielectric material 28 may or may not comprise a composition in common with the dielectric material 22.

Four of the wordlines are labeled as 26a, 26b, 26c and 26d (WL1, WL2, WL3 and WL4), respectively, so that they may be distinguished relative to one another and relative to the other wordlines. The wordlines WL1, WL2, WL3 and WL4 are in lateral order along the cross-section of FIG. 1A, and may be referred to as first, second, third and fourth wordlines, respectively.

The wordlines (specifically, transistor gates along the wordlines) may be considered to be operatively adjacent to (operatively proximate to) the channel regions 20 such that a sufficient voltage applied to an individual wordline (e.g., the wordline 26a) will induce an electric field which enables current flow through the associated channel region (e.g., the channel region 20 within the pillar 12a) to electrically couple the source/drain regions on opposing sides of the channel region with one another. If the voltage to the wordline is below a threshold level, the current will not flow through the channel region, and the source/drain regions on opposing sides of the channel region will not be electrically coupled with one another. The selective control of the coupling/decoupling of the source/drain regions through the level of voltage applied to the wordline may be referred to as gated coupling of the source/drain regions.

Each of the pillars 12 is uniquely coupled to one of the wordlines 26 and one of the digit lines 24; and accordingly each of the pillars 12 may be considered to be uniquely addressed by one of the wordlines and one of the digit lines. For instance, the pillar 12a may be considered to be uniquely addressed by the digit line 24b (DL2) and the wordline 26a (WL1), the pillar 12b may be considered to be uniquely addressed by the digit line 24b (DL2) and the wordline 26b (WL2), etc.

The pillars 12, together with the wordlines associated with such pillars, may be considered to be comprised by access transistors 34. Four of the access transistors are labeled as 34a, 34b, 34c and 34d so that they may be distinguished from another and from the other access transistors. The illustrated transistors 34 may be referred to as vertically-extending transistors since they comprise the vertically-extending channel regions 20.

The digit lines 24 extend along an illustrated y-axis direction, and the wordlines 26 extend along an illustrated x-axis direction. In some embodiments, one of the x-axis and y-axis directions may be referred to as a first direction and the other may be referred to as a second direction.

Electrical nodes (cell contacts) 30 are over and directly adjacent the upper source/drain regions 16. Four of the electrical nodes are labeled as 30a, 30b, 30c and 30d so that they may be distinguished relative to one another, and relative to the other electrical nodes. The electrical nodes 30a, 30b, 30c and 30d may be referred to as first, second, third and fourth electrical nodes, respectively. Each of the electrical nodes 30 may be considered to be associated with one of the upper source/drain regions 16. For instance, the electrical nodes 30a, 30b, 30c and 30d are associated with the upper source/drain regions 16a, 16b, 16c and 16d, respectively.

The electrical nodes 30 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The electrical nodes 30 are spaced from one another by insulating material 32. The insulating material 32 may comprise any suitable composition(s); and in some embodiments may comprise, consist essentially of, or consist of silicon nitride.

A planarized upper surface 23 extends across the insulative material 32 and the electrical nodes 30. The planarized surface 23 may be formed utilizing chemical-mechanical polishing (CMP) and/or any other suitable process(es). In some embodiments, the surface 23 may be referred to as an upper surface of the construction 10.

The digit lines 24 are supported by an underlying insulative material 36. Such material may comprise any suitable composition(s); and in some embodiments may comprise, consist essentially of, or consist of one or more of silicon dioxide, silicon nitride, aluminum oxide, etc.

The insulative material 36 is supported by a semiconductor base 38. The base 38 may comprise semiconductor material; and may, for example, comprise, consist essentially of, or consist of monocrystalline silicon. The base 38 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base may correspond to a semiconductor substrate containing one or more materials associated with integrated circuit fabrication. Such materials may include, for example, one or more of refractory metal materials, barrier materials, diffusion materials, insulator materials, etc.

A gap is provided between the base 38 and the insulative material 36 to indicate that there may be additional components, materials, etc., provided between the base 38 and the insulative material 36. For instance, in some embodiments (described below) the digit lines 24 and wordlines 26 may be coupled with logic circuitry (e.g., sense-amplifier-circuitry, wordline-driver-circuitry, etc.), and at least some of such logic circuitry may be provided in the illustrated gap between the base 38 and the digit lines 24.

Figure 2:
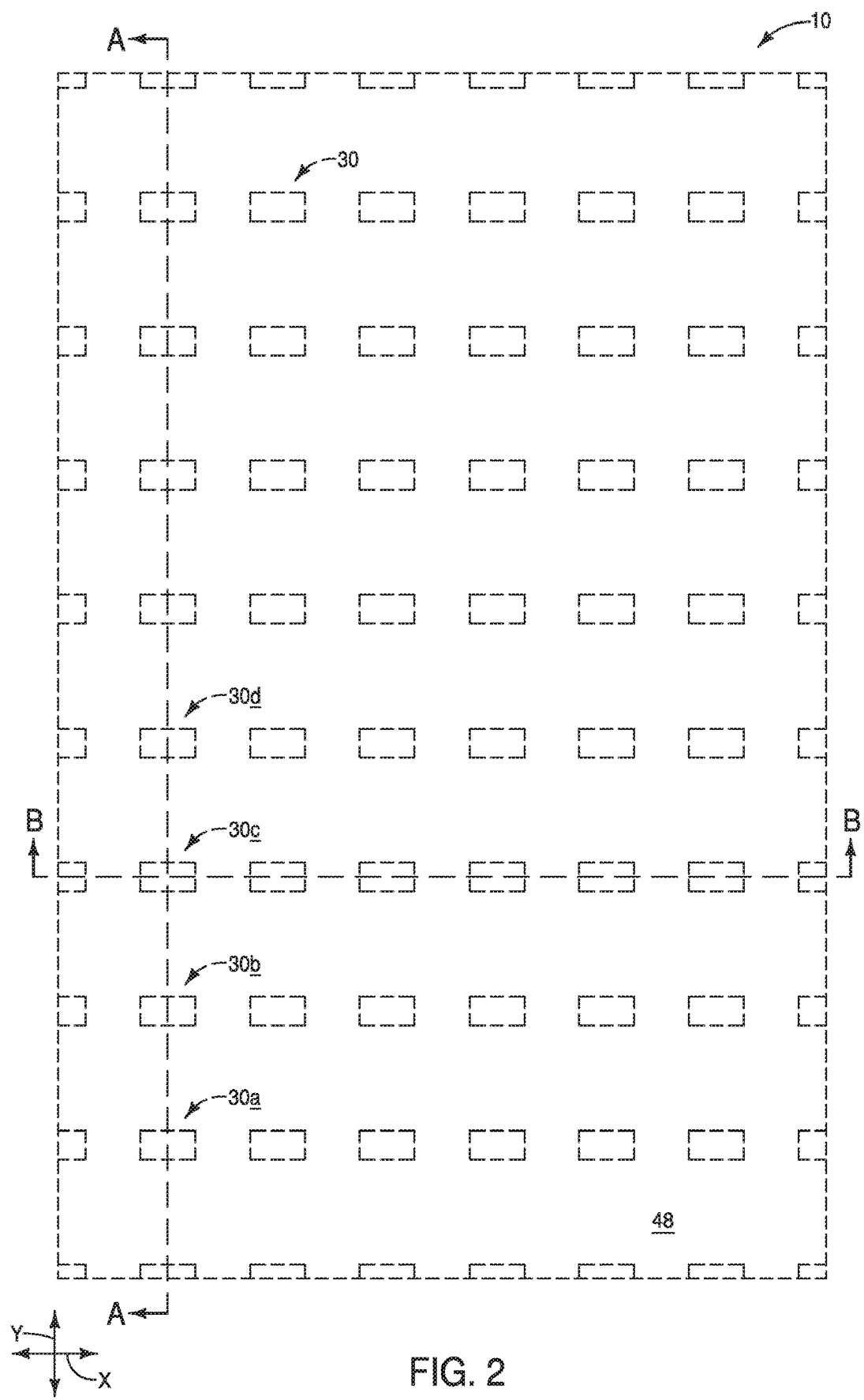
FIGS. 2-2B are diagrammatic views of the region of FIGS. 1-1B at an example process stage following that of FIGS. 1-1B.
Figure 2A:
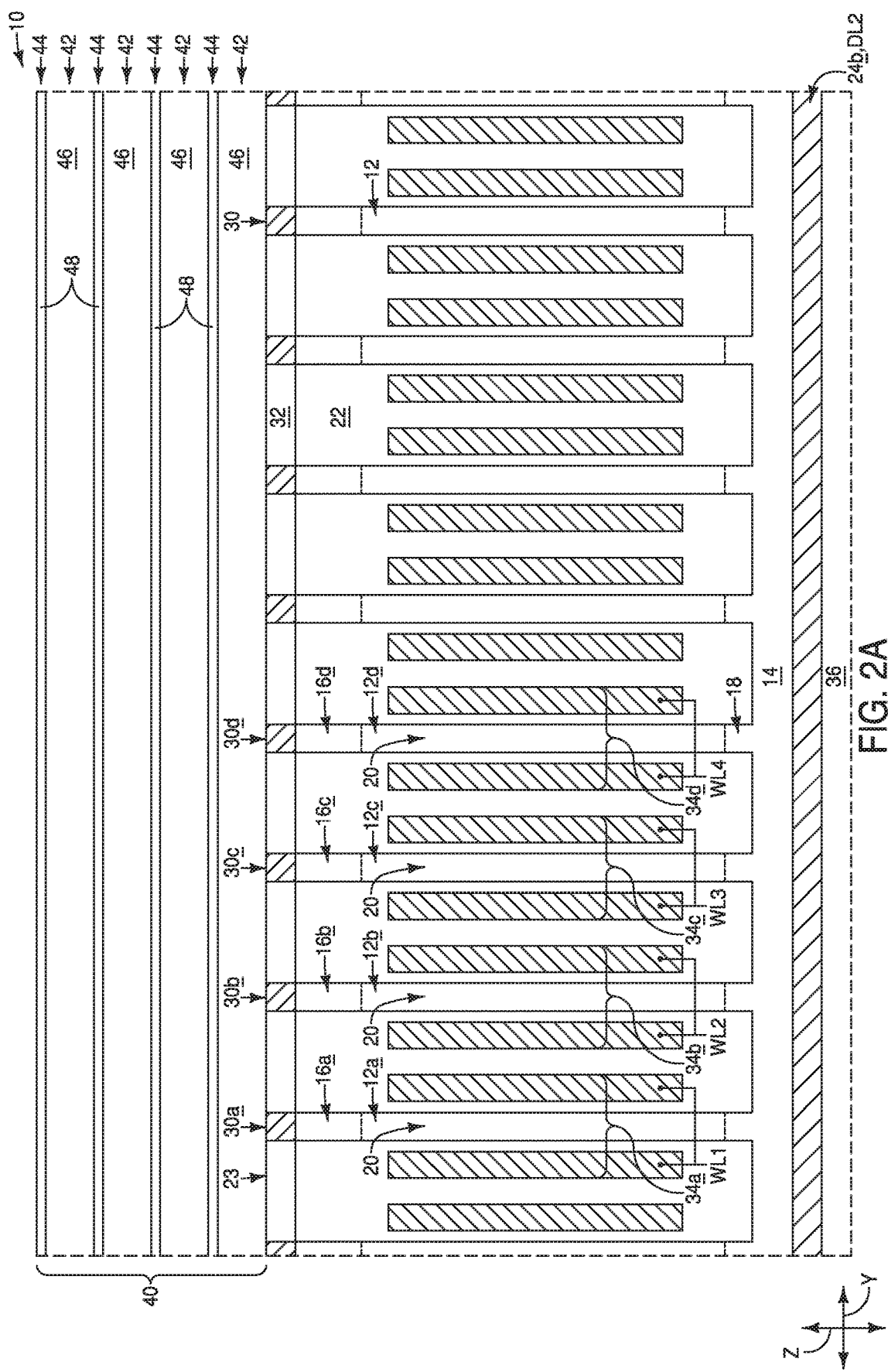
Figure 2B:
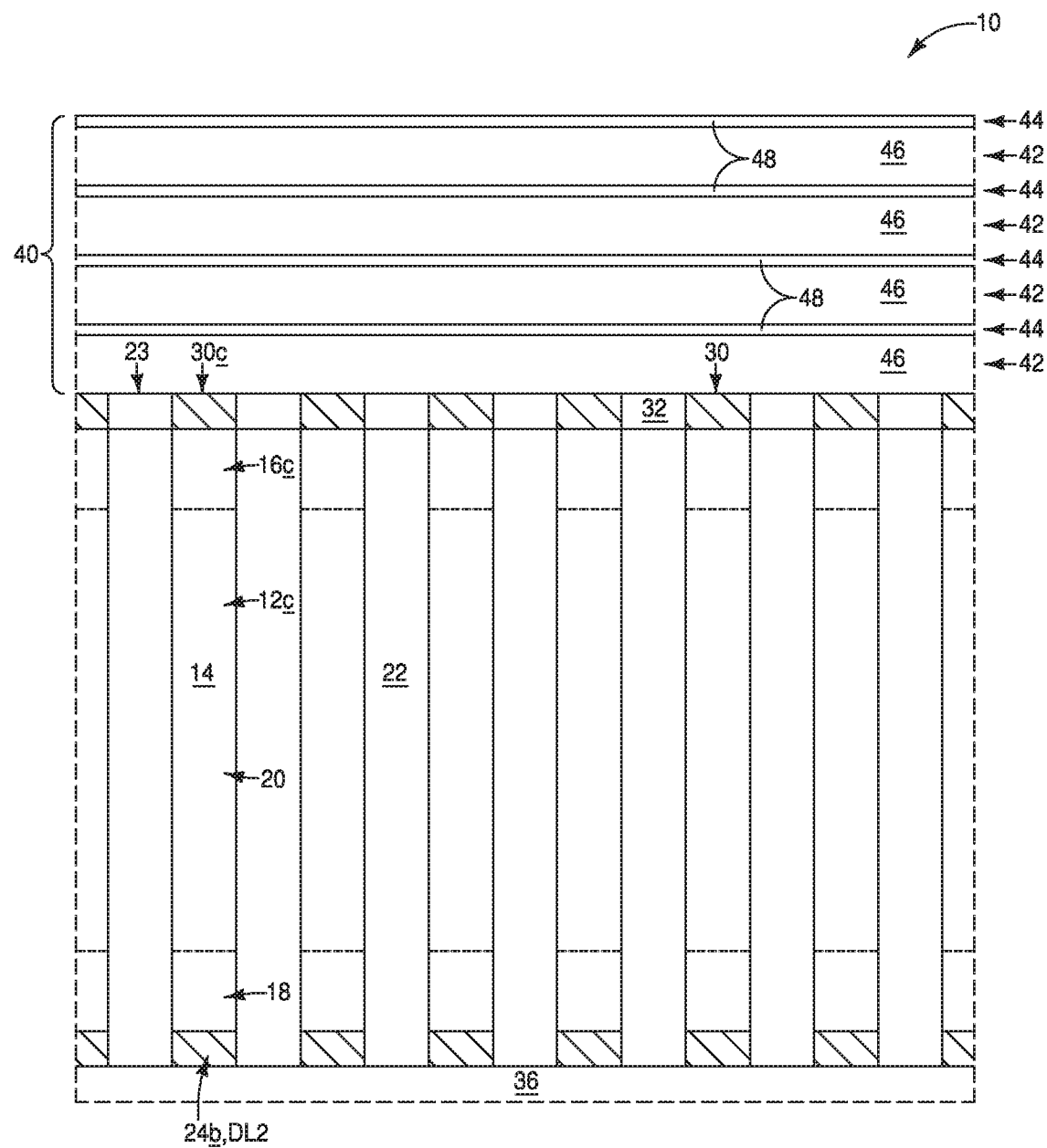

Referring to FIGS. 2-2B, a stack 40 is formed over the planarized surface 23. The stack 40 comprises alternating first and second levels 42 and 44. The first levels 42 comprise a sacrificial material 46, and the second levels 44 comprises a scaffold material 48.

The sacrificial material 46 may comprise any suitable composition(s); and in some embodiments may comprise, consist essentially of, or consist of one or both of silicon dioxide and carbon. The silicon dioxide may be doped (e.g., may be in the form of borophosphosilicate glass, phosphosilicate glass, fluorosilicate glass, etc.). The sacrificial material 46 may be referred to as a first sacrificial material to distinguish it from other sacrificial materials formed at subsequent process stages.

The scaffold material 48 may comprise any suitable composition(s); and in some embodiments may comprise, consist essentially of, or consist of silicon nitride.

The base 38 is not shown in the cross-sections of FIGS. 2A and 2B (and is not shown at process stages following that of FIGS. 2A and 2B), to simplify the drawings.

The electrical nodes 30 are shown in dashed-line (phantom) view in FIG. 2 to indicate that they are under other materials.

Figure 3:
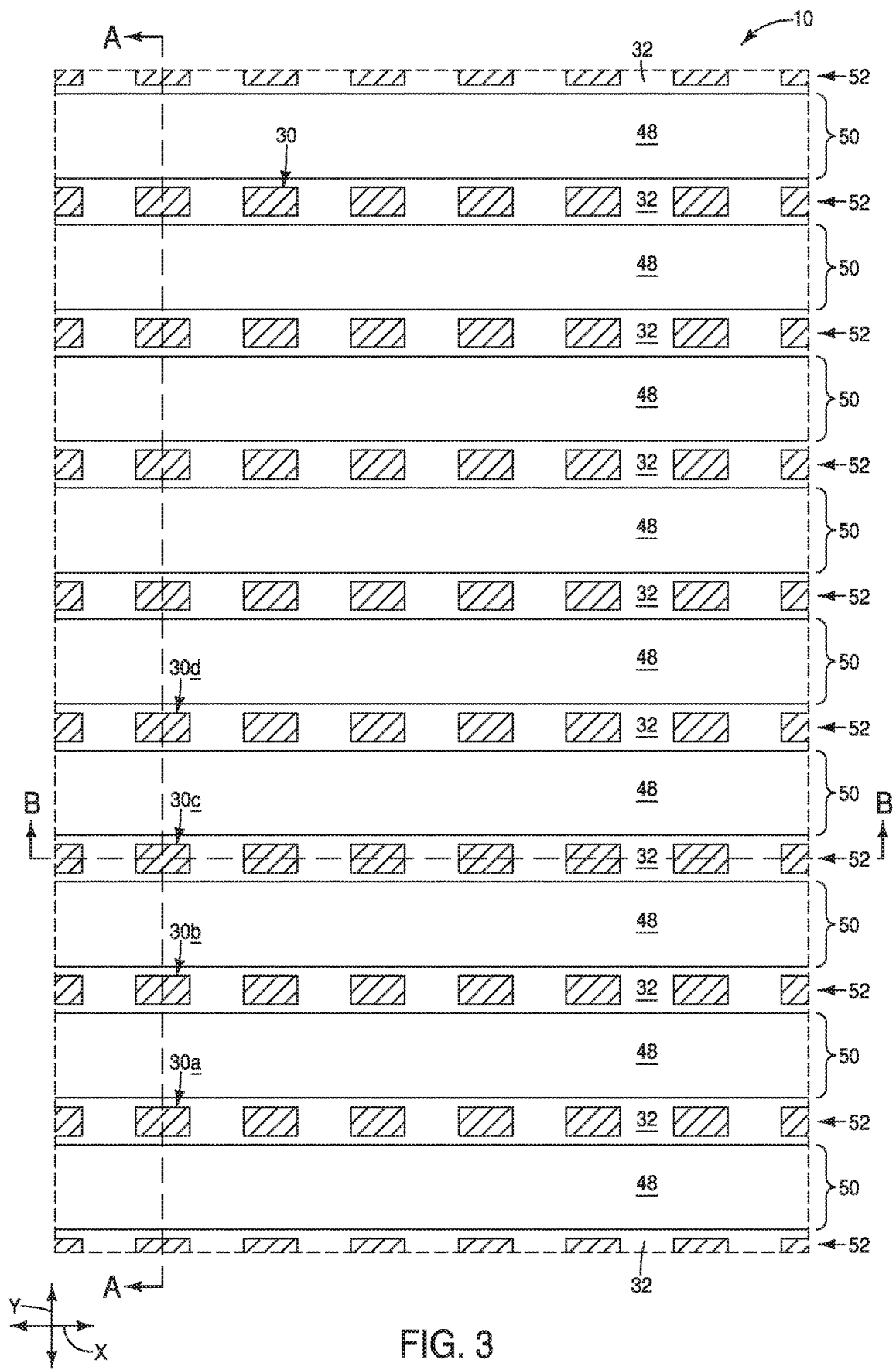
FIGS. 3-3B are diagrammatic views of the region of FIGS. 1-1B at an example process stage following that of FIGS. 2-2B.
Figure 3A:
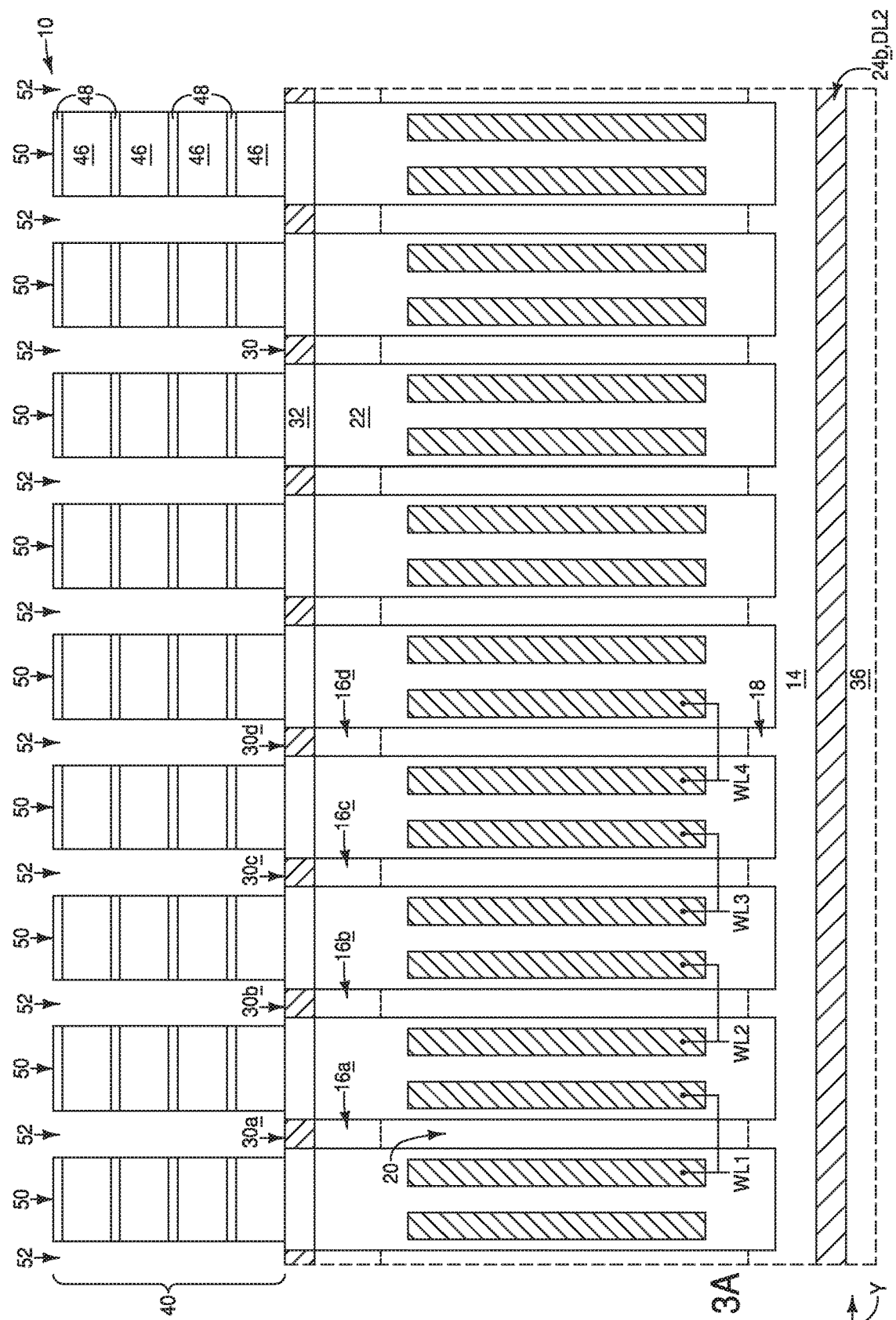
Figure 3B:
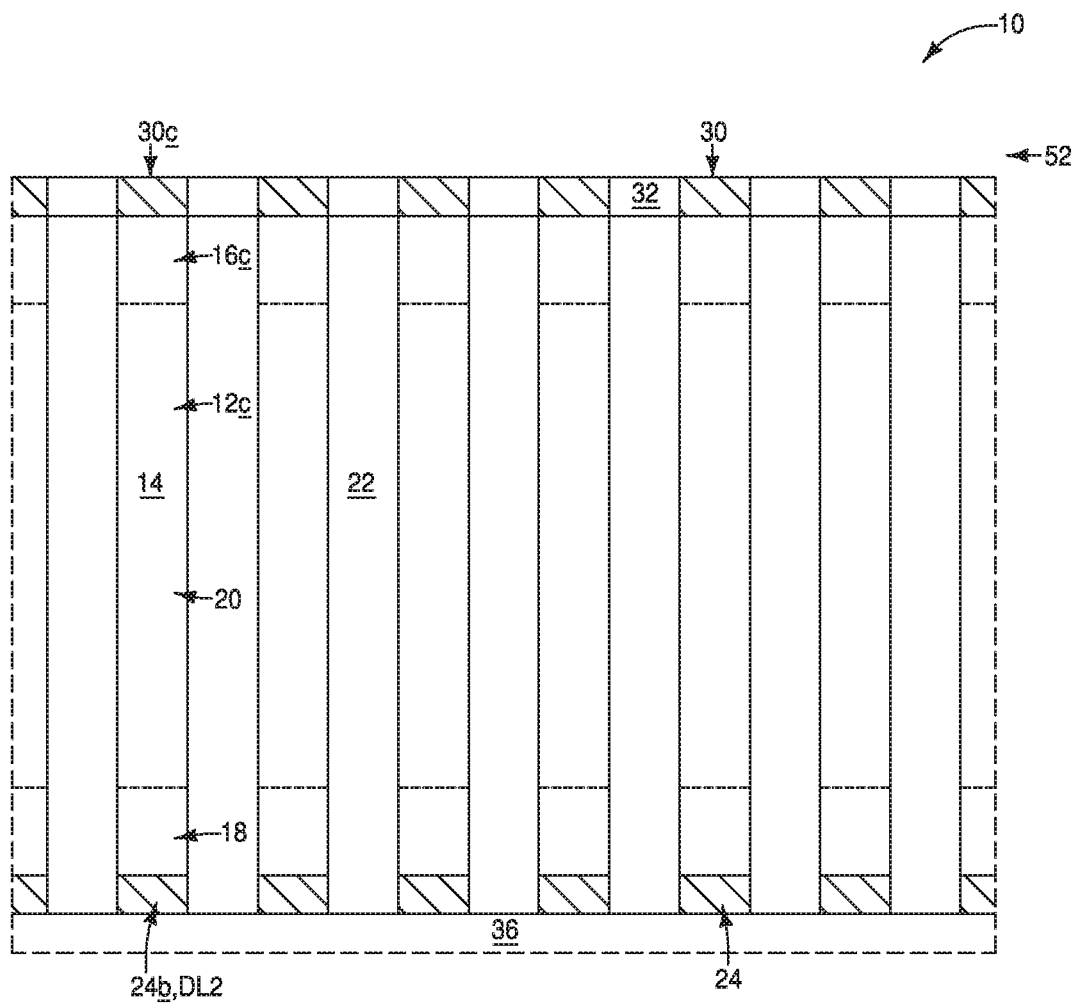

Referring to FIGS. 3-3B, the stack 40 is patterned into rails 50, with such rails being spaced from one another by intervening trenches 52. The trenches 52 may be referred to as first trenches to distinguish them from other trenches formed at subsequent process stages. The rails 50 and trenches 52 extend along the illustrated x-axis direction.

Upper surfaces of the electrical nodes 30 are exposed at bottoms of the trenches 52.

The stack 40 may be patterned utilizing any suitable processing. For instance, a patterned photoresist mask (not shown) may be utilized to define locations of the rails 50 and trenches 52, a pattern may be transferred from the mask into the stack 40 with one or more suitable etches, and then the mask may be removed to leave the configuration of FIGS. 3-3B.

Figure 4:
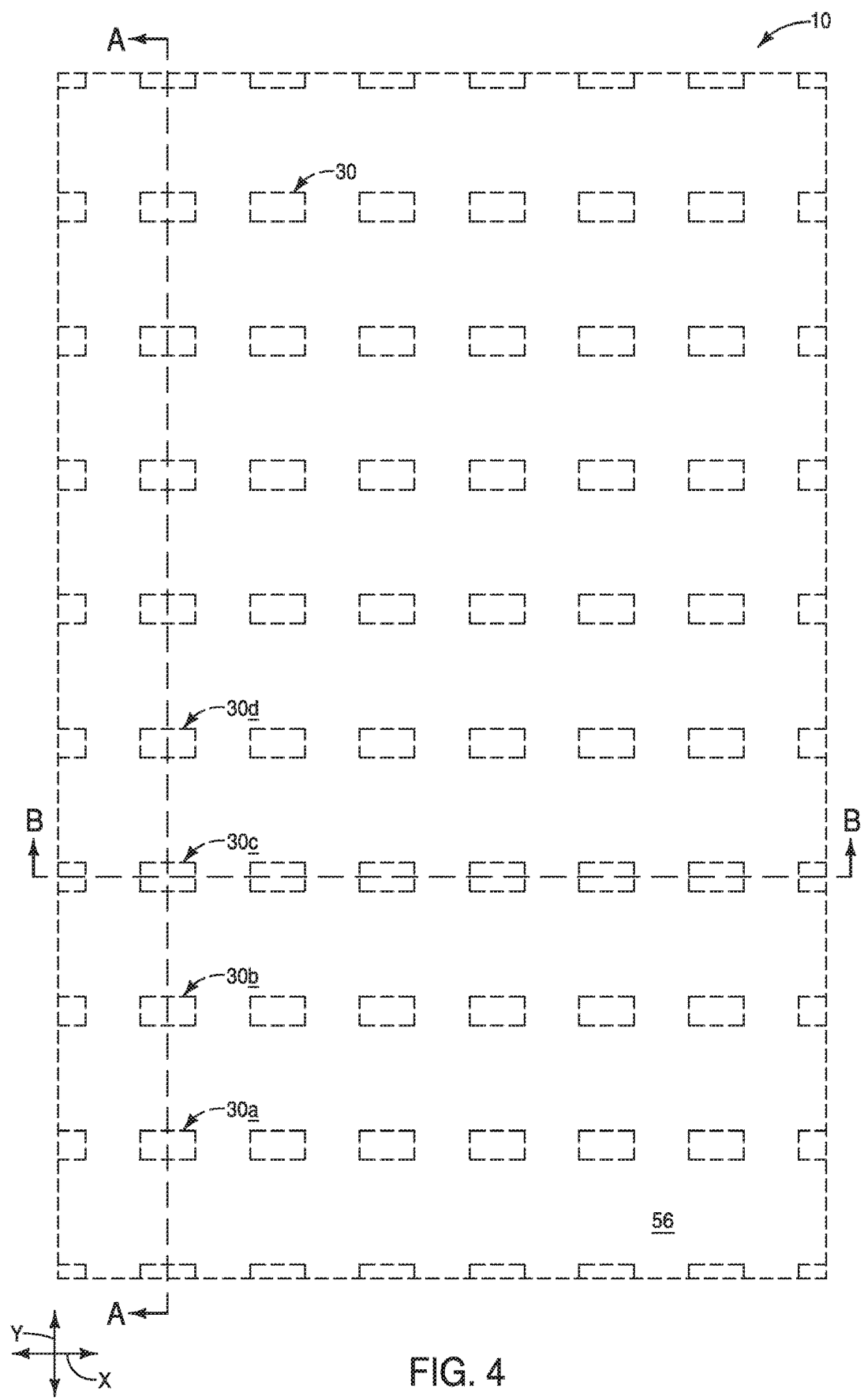
FIGS. 4-4B are diagrammatic views of the region of FIGS. 1-1B at an example process stage following that of FIGS. 3-3B.
Figure 4A:
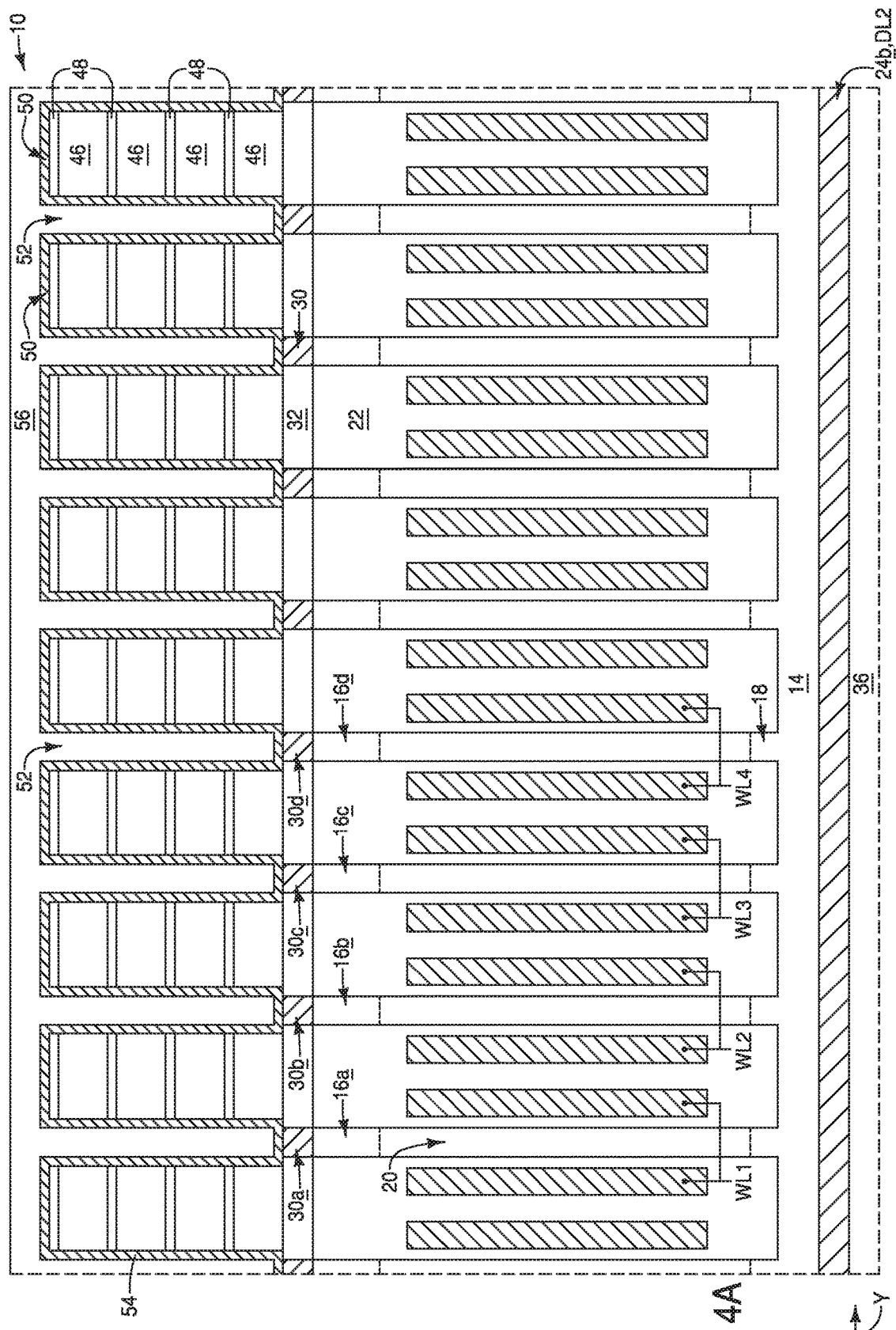
Figure 4B:
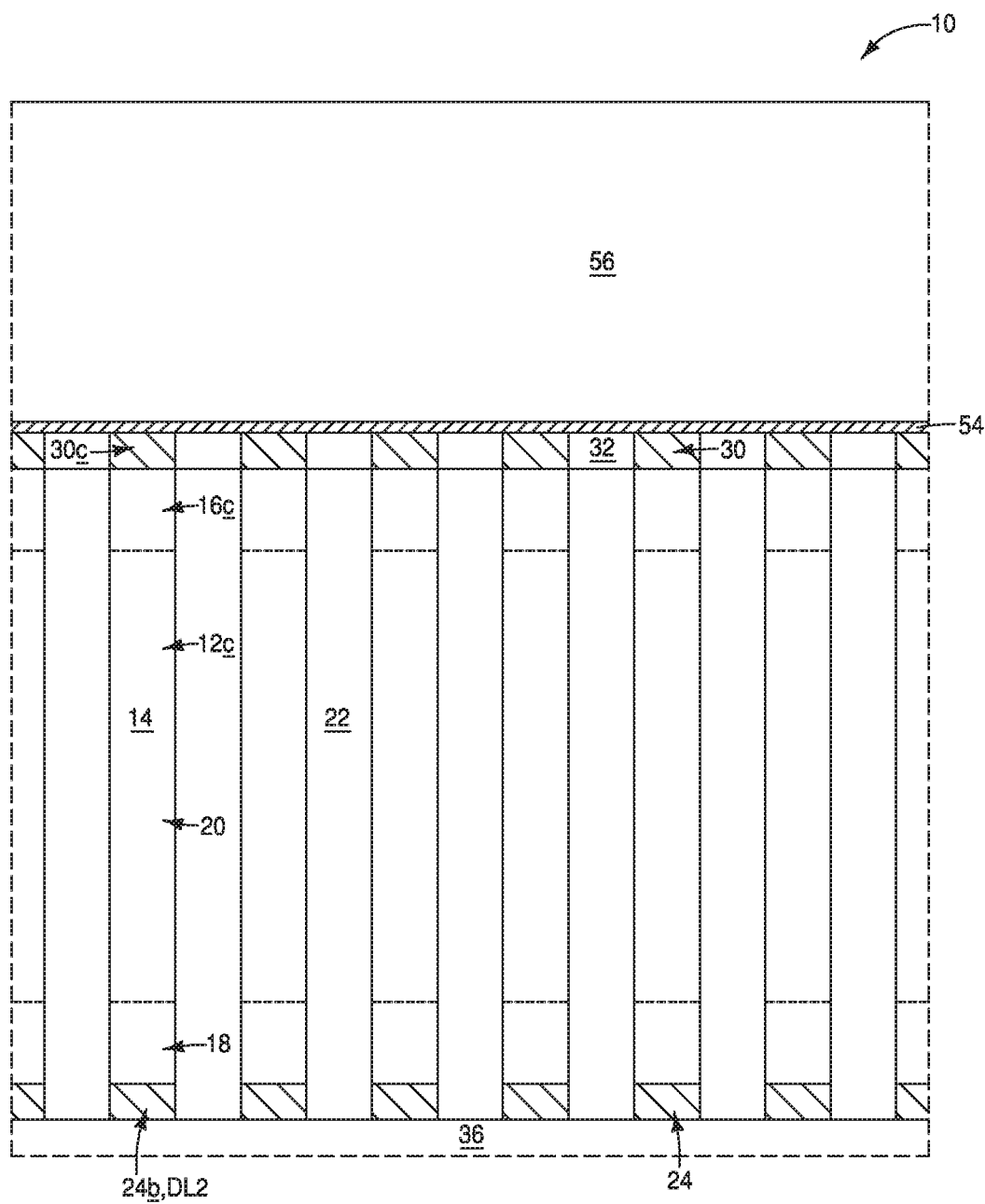

Referring to FIGS. 4-4B, bottom-electrode-material 54 is formed over the rails 50 and within the trenches 52. The bottom-electrode-material 54 narrows the trenches 52.

The bottom-electrode-material 54 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

Spacer material 56 is formed over the bottom-electrode-material 54, and within the narrowed trenches 52. The spacer material 56 may comprise any suitable composition(s); and in some embodiments may comprise, consist essentially of, or consist of one or both of silicon dioxide and carbon. The silicon dioxide may be doped (e.g., the silicon dioxide may be in the form of borophosphosilicate glass, phosphosilicate glass, fluorosilicate glass, etc.). The spacer material 56 may or may not comprise a same composition as the sacrificial material 46.

Figure 5:
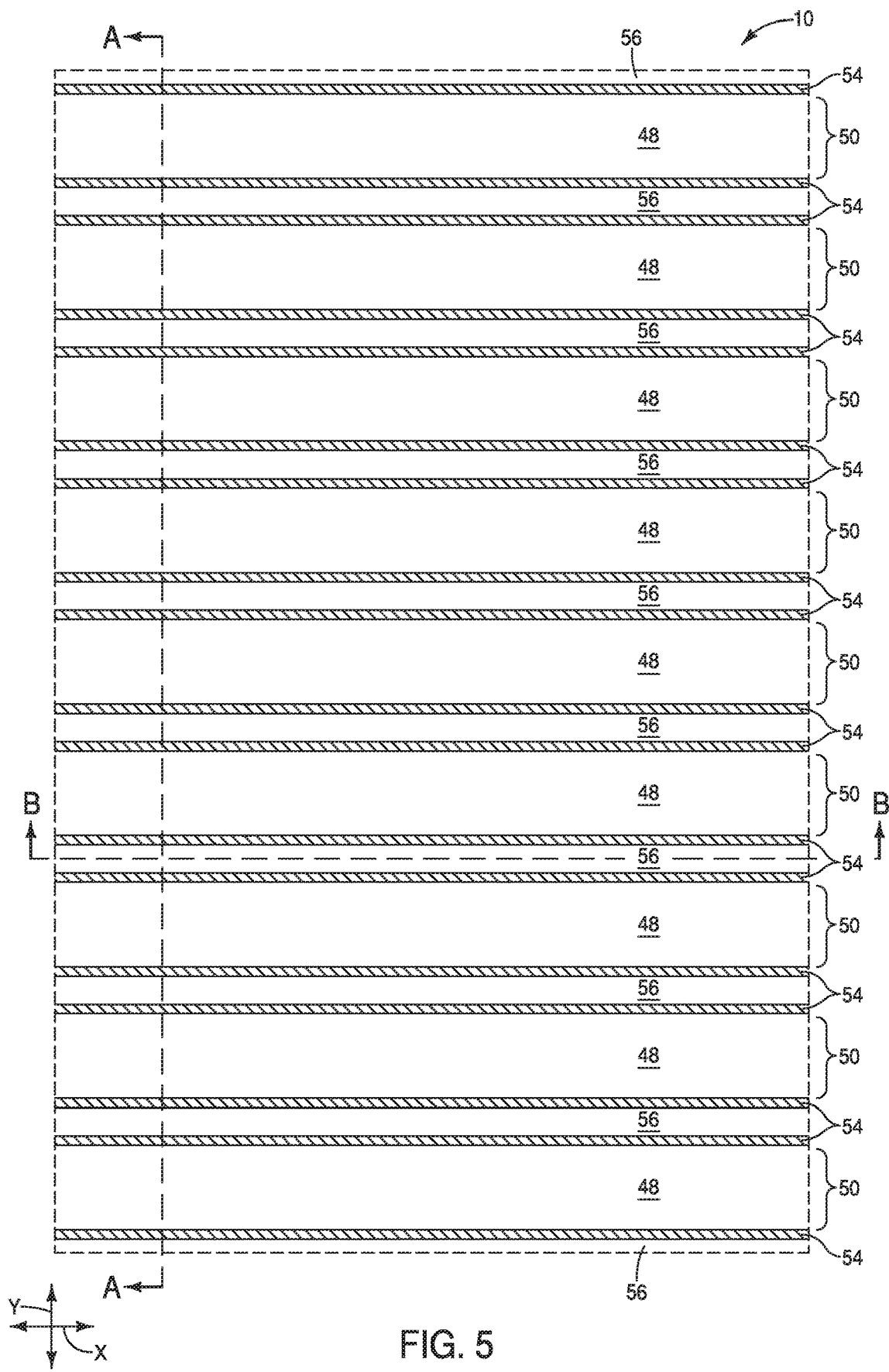
FIGS. 5-5B are diagrammatic views of the region of FIGS. 1-1B at an example process stage following that of FIGS. 4-4B.
Figure 5A:
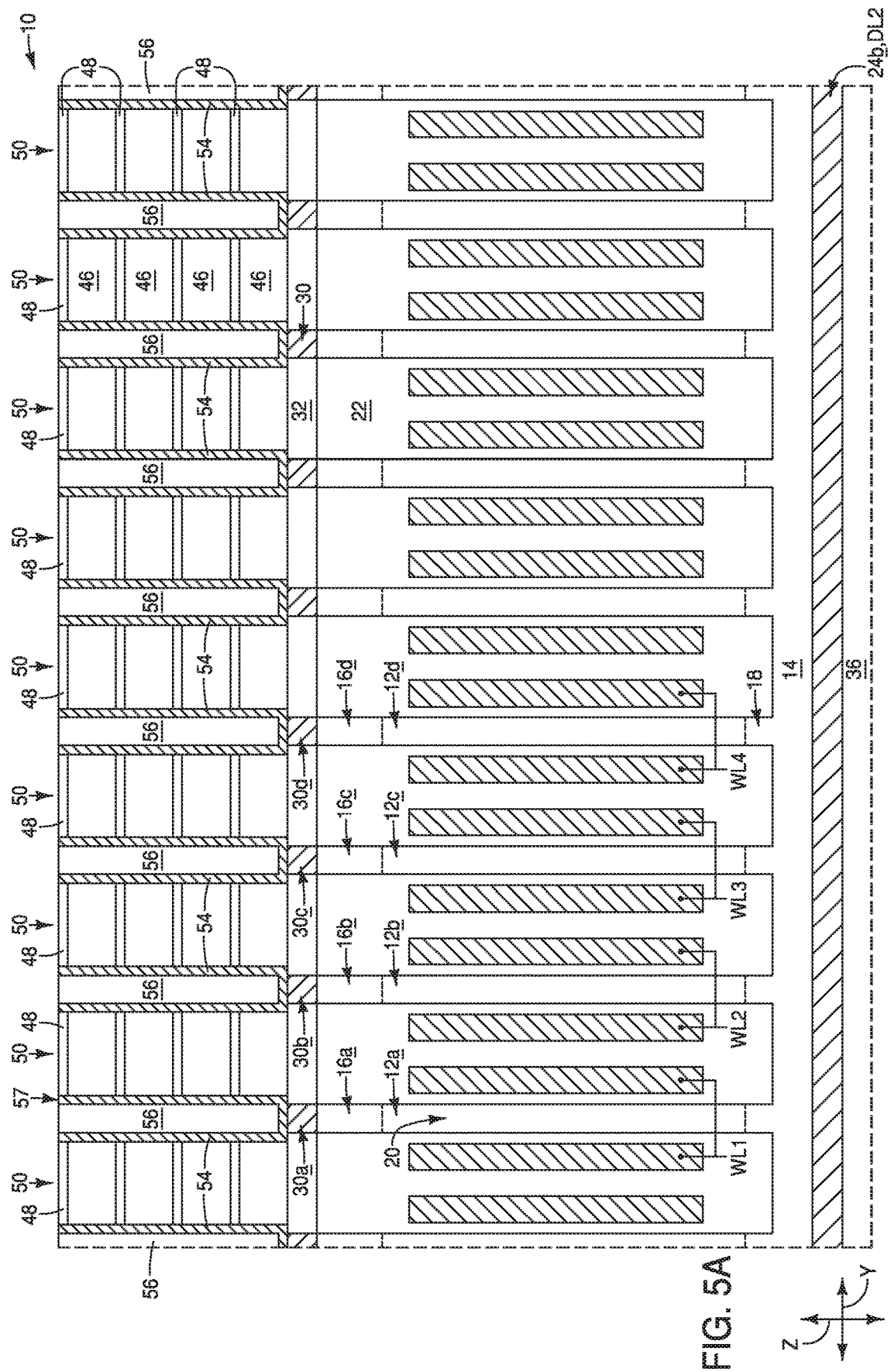
Figure 5B:
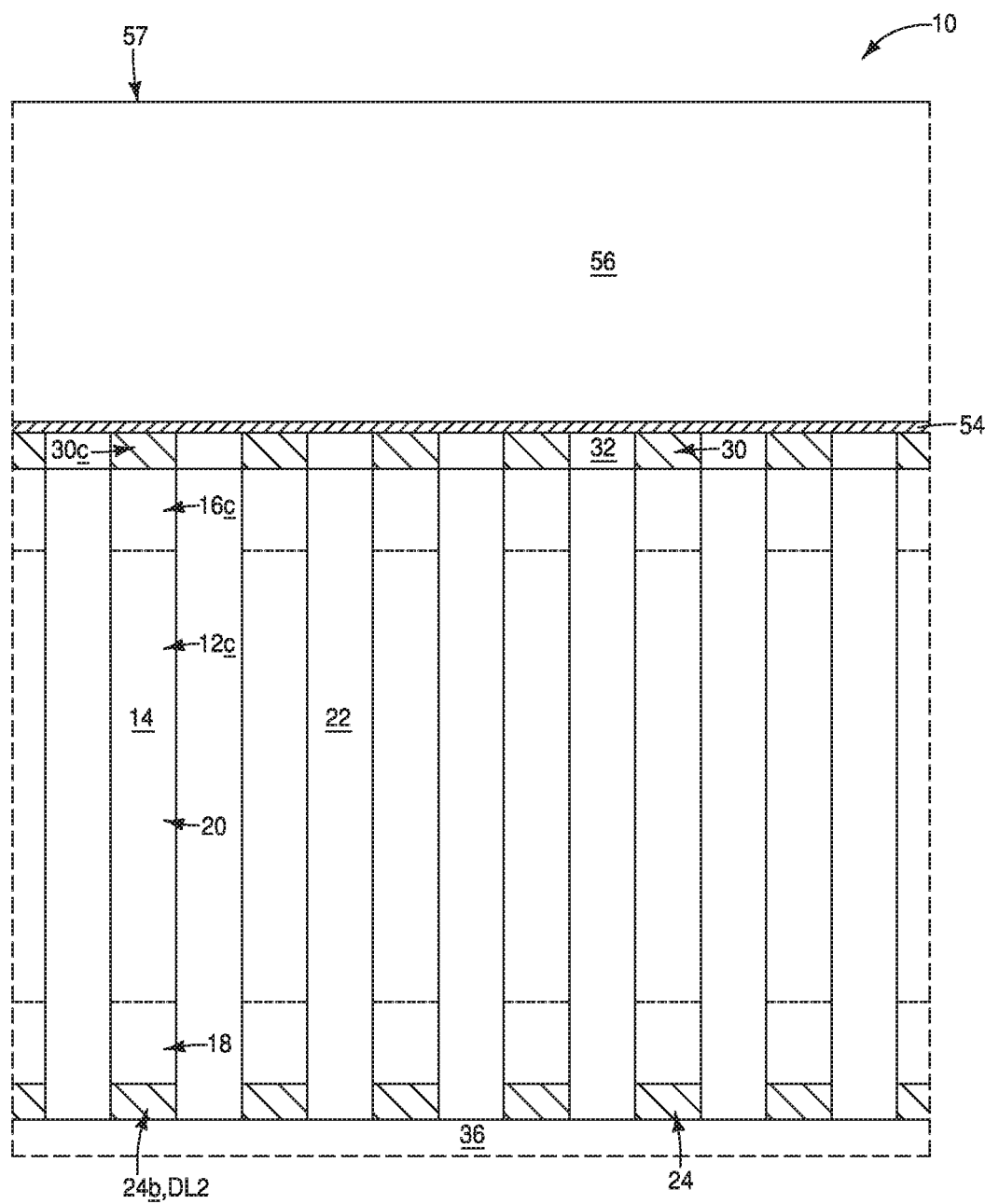

Referring to FIGS. 5-5B, a planarized surface 57 is formed to extend across the materials 48, 54 and 56. The planarized surface 57 may be formed with any suitable processing, including, for example, chemical-mechanical polishing (CMP).

The planarization exposes the upper layers 48 of the rails 50.

Figure 6:
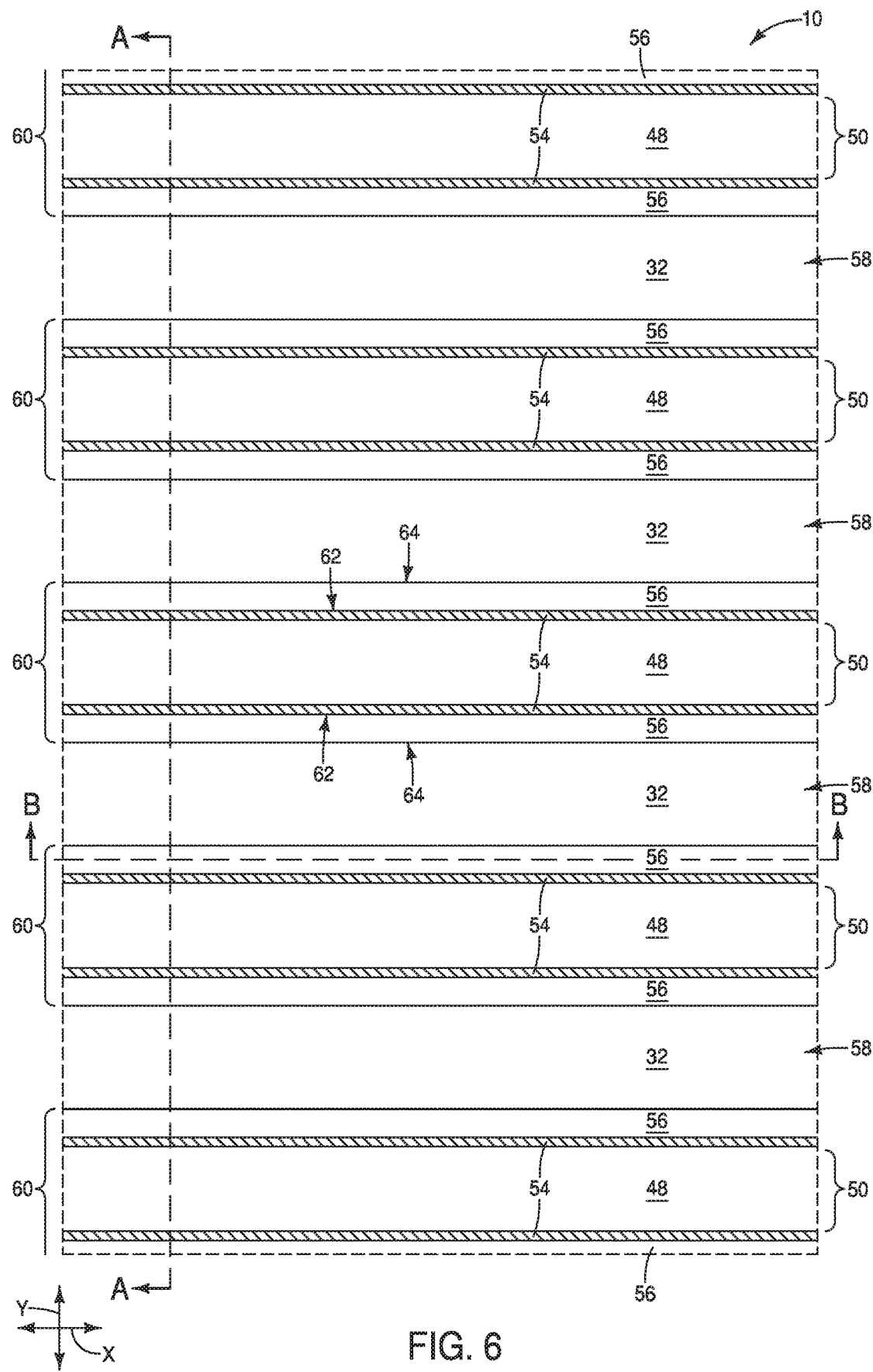
FIGS. 6-6B are diagrammatic views of the region of FIGS. 1-1B at an example process stage following that of FIGS. 5-5B.
Figure 6A:
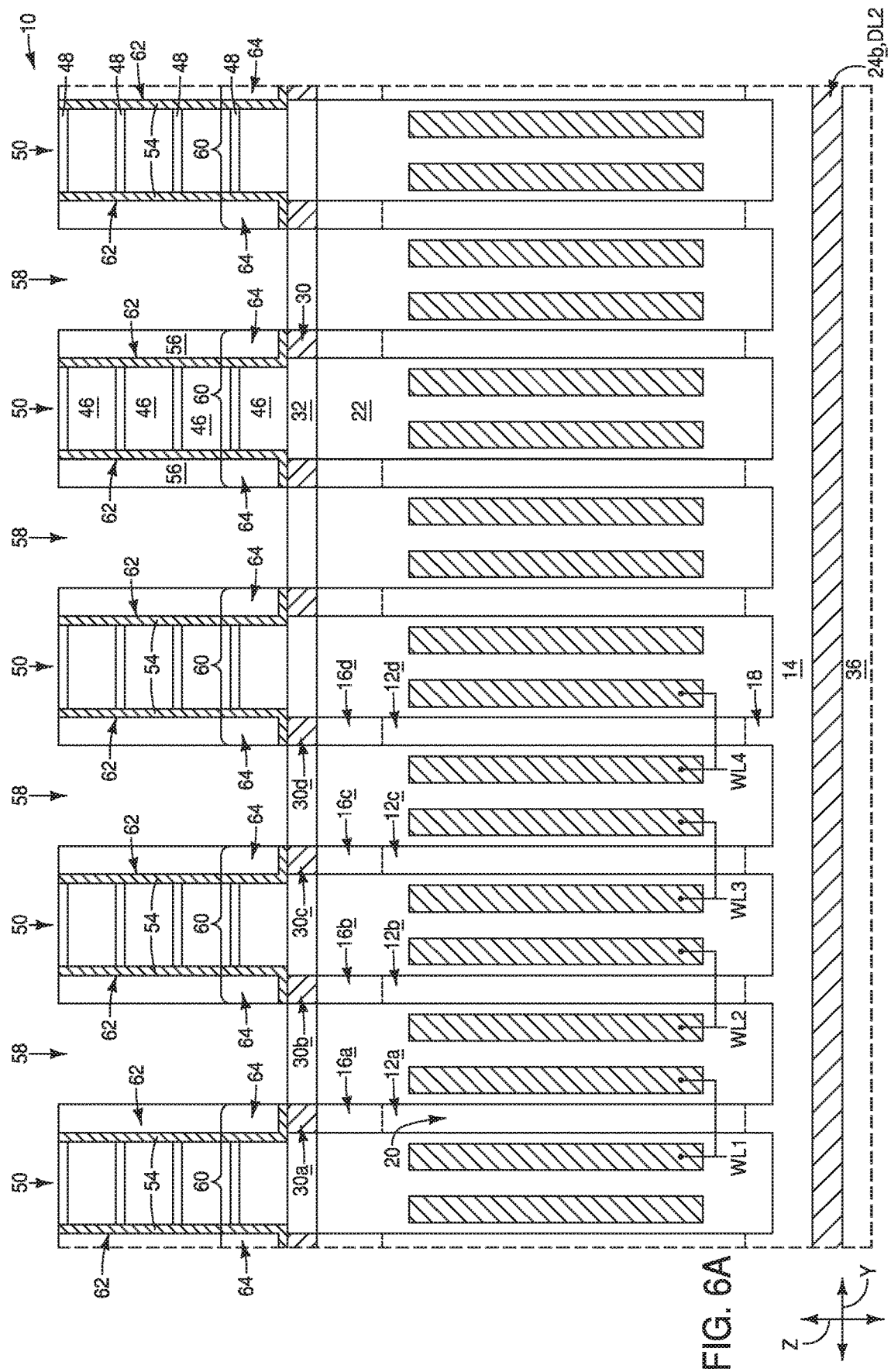
Figure 6B:
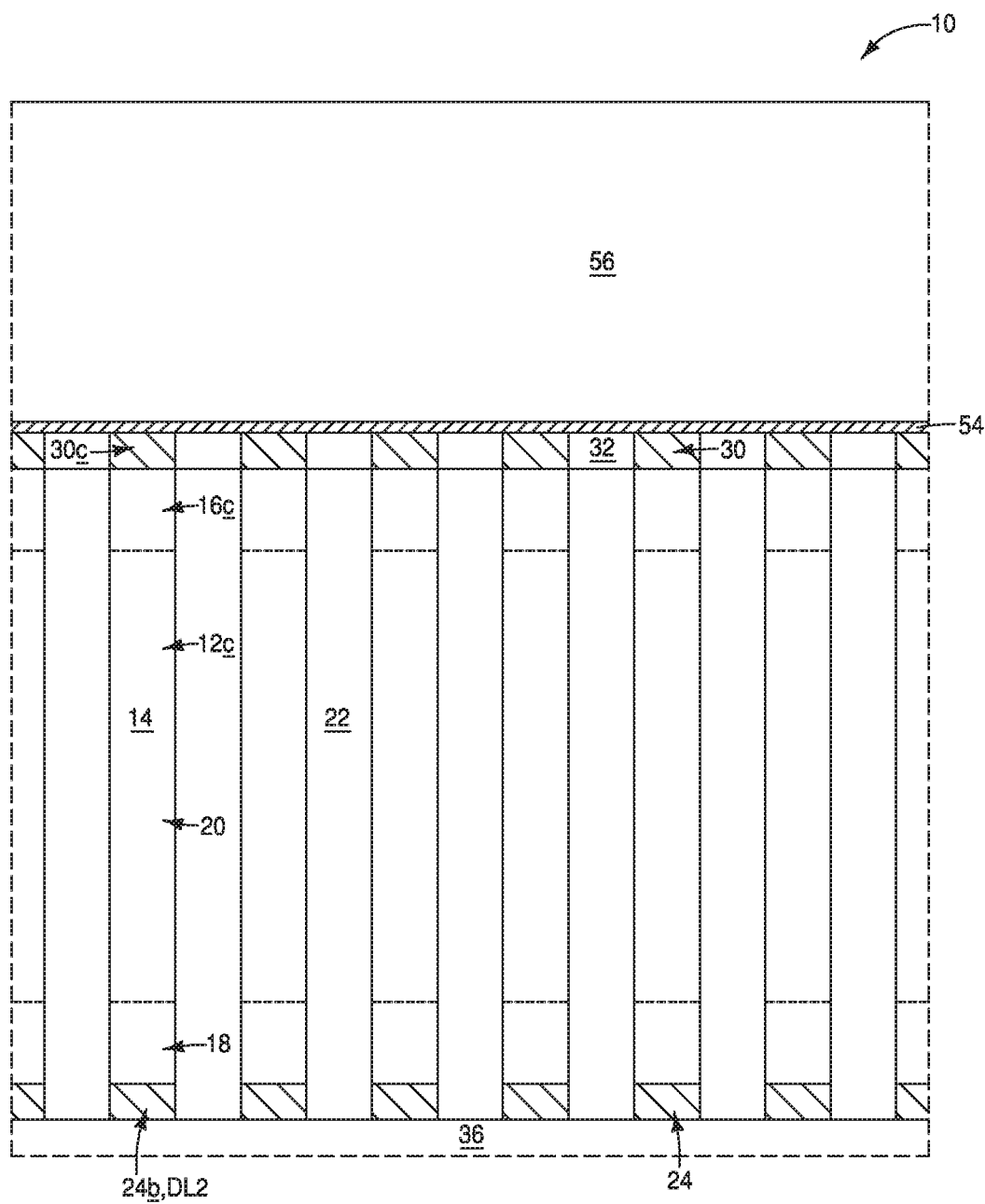

Referring to FIGS. 6-6B, second trenches 58 are formed by removing every other one of the rails 50 and removing the bottom-electrode-material 54 along the sidewalls of said every other one of the rails. The second trenches may be patterned utilizing a patterned photoresist mask (not shown) and one or more suitable etches.

The remaining rails 50 are incorporated into beams 60. Such beams extend along the x-axis direction (i.e., extend along a same direction as the wordlines WL1, WL2, etc.).

Each of the beams 60 includes a pair of angle plates 62 patterned from the bottom-electrode-material 54, and comprises a pair of panels 64 corresponding to the spacer material 56. The panels 64 are spaced from the rails 50 by the bottom-electrode-material 54 of the angle plates 62.

Figure 7:
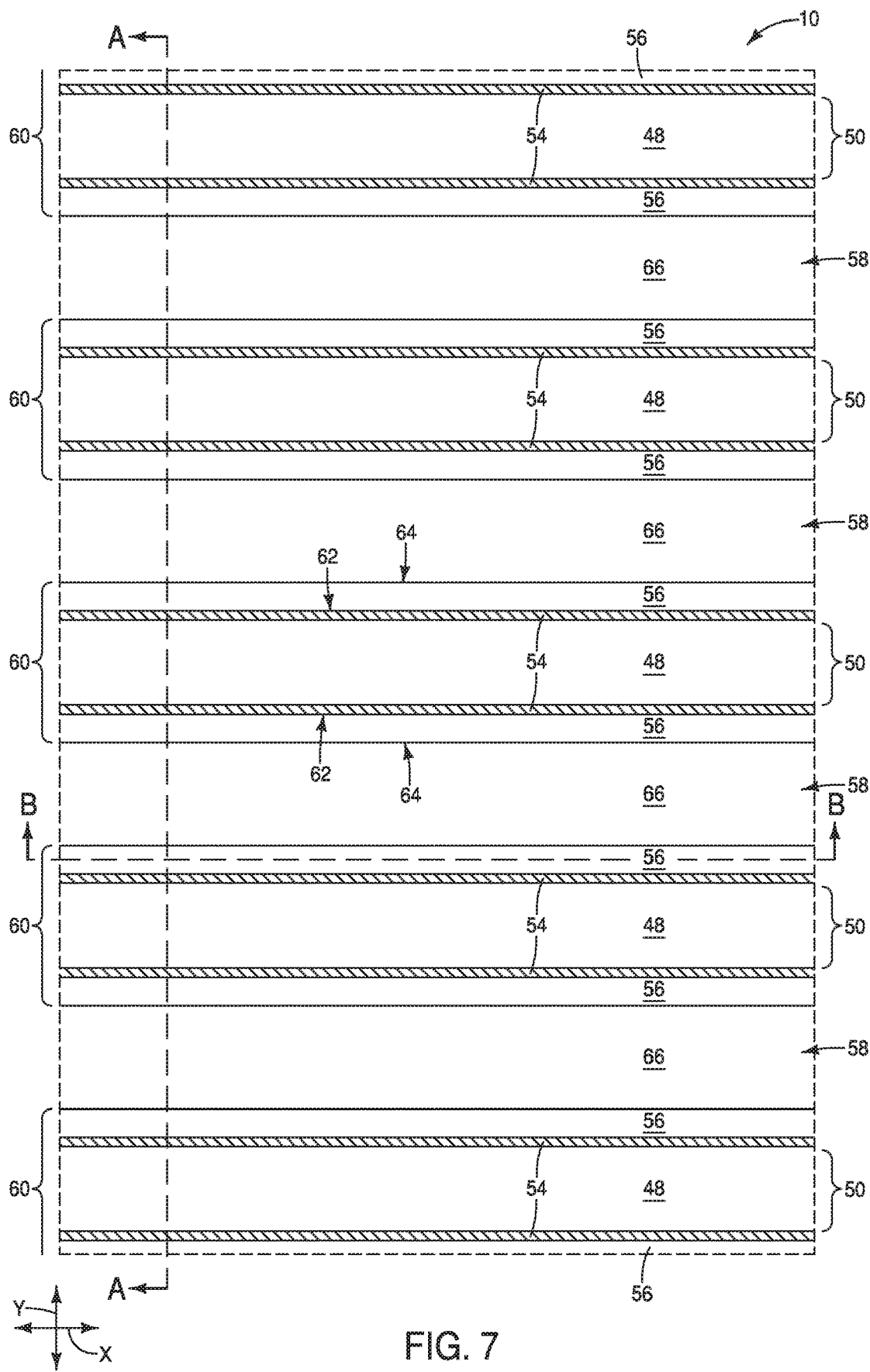
FIGS. 7-7B are diagrammatic views of the region of FIGS. 1-1B at an example process stage following that of FIGS. 6-6B.
Figure 7A:
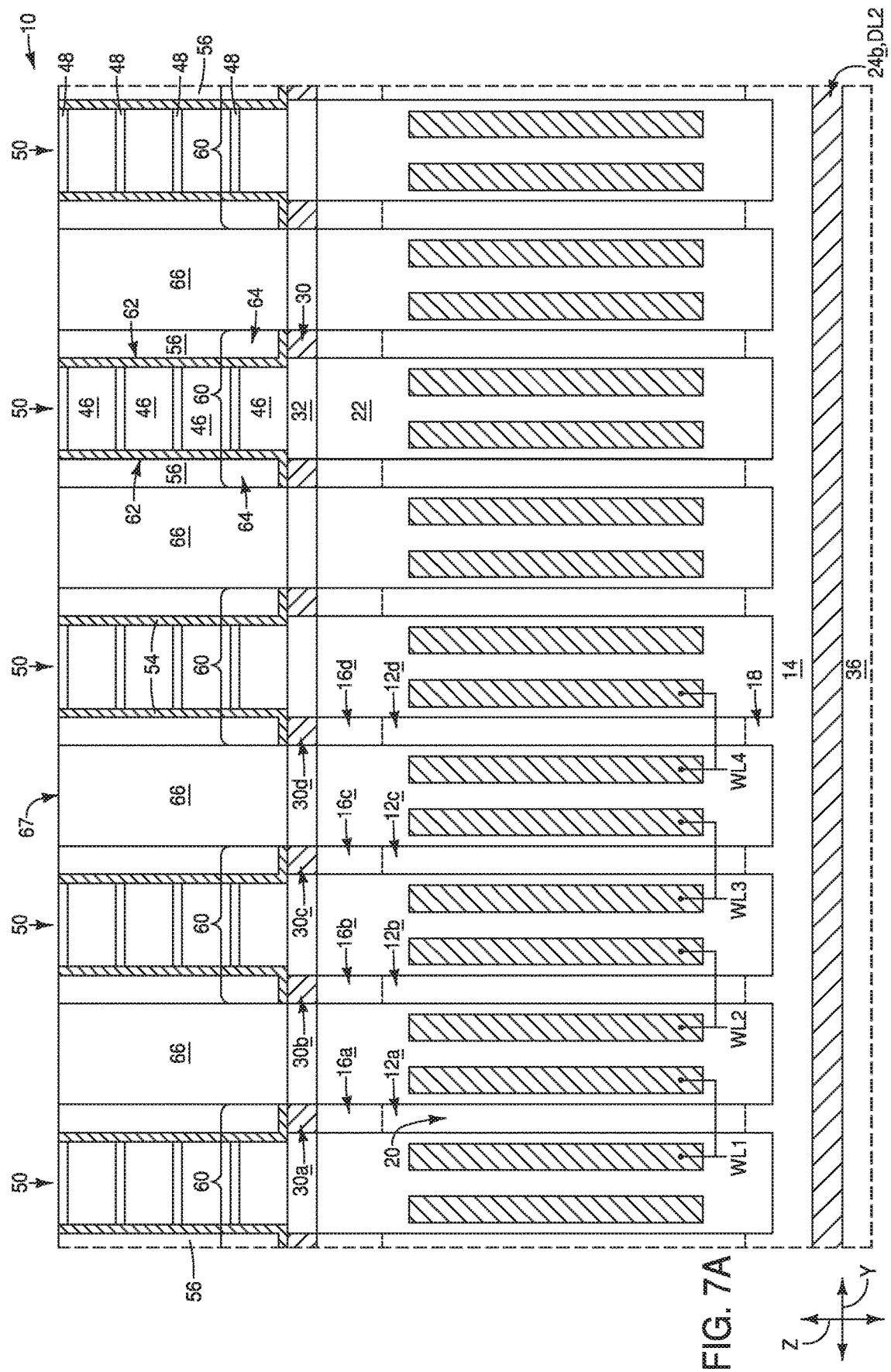
Figure 7B:
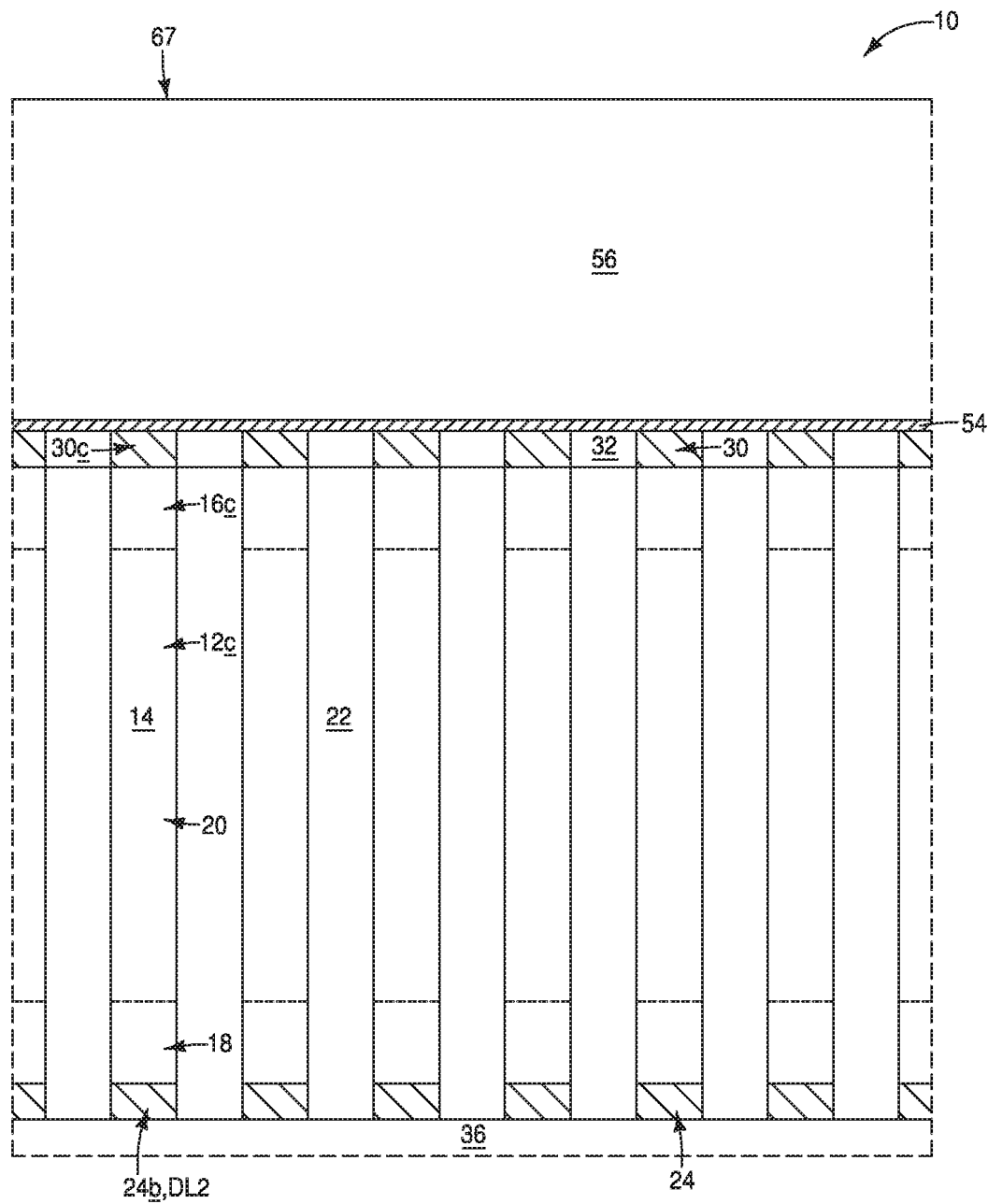
Figure 7B:
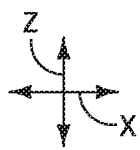

Referring to FIGS. 7-7B, sacrificial material 66 is formed within the trenches 58. The sacrificial material 66 may be referred to as a second sacrificial material to distinguish it from the first sacrificial material 46. The sacrificial material 66 may comprise any suitable composition(s); and in some embodiments may comprise one or both of silicon dioxide and carbon. The silicon dioxide may be doped (e.g., may correspond to borophosphosilicate glass, phosphosilicate glass, fluorosilicate glass, etc.). The second sacrificial material 66 may comprise a same composition as one or both of the first sacrificial material 46 and the panel material 56, or may comprise a different composition relative to both of the materials 46 and 56.

A planarized surface 67 is formed to extend across the materials 48, 54, 56 and 66. The planarized surface 67 may be formed with any suitable processing, including, for example, CMP.

Figure 8:
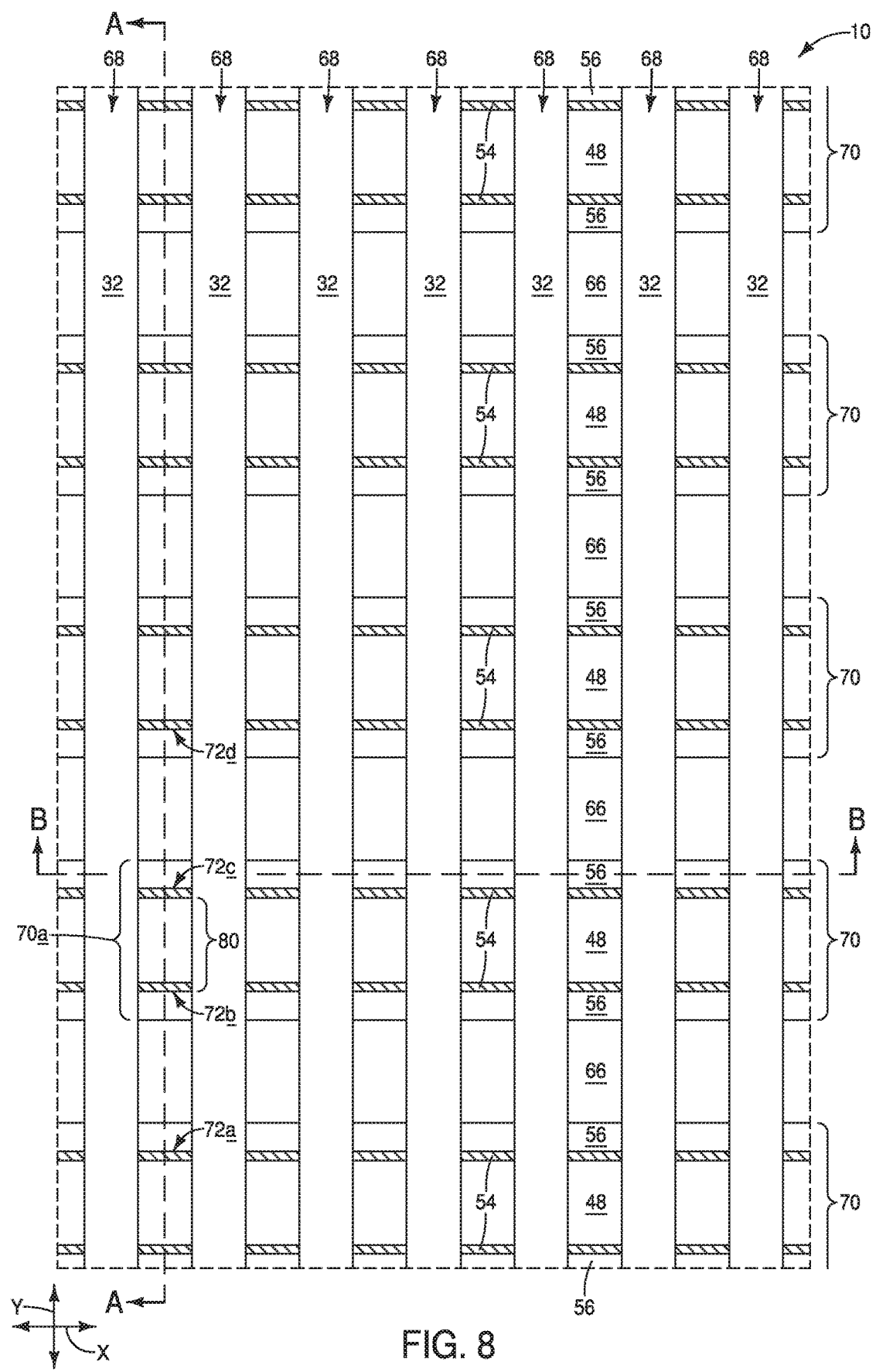
FIGS. 8-8B are diagrammatic views of the region of FIGS. 1-1B at an example process stage following that of FIGS. 7-7B.
Figure 8A:
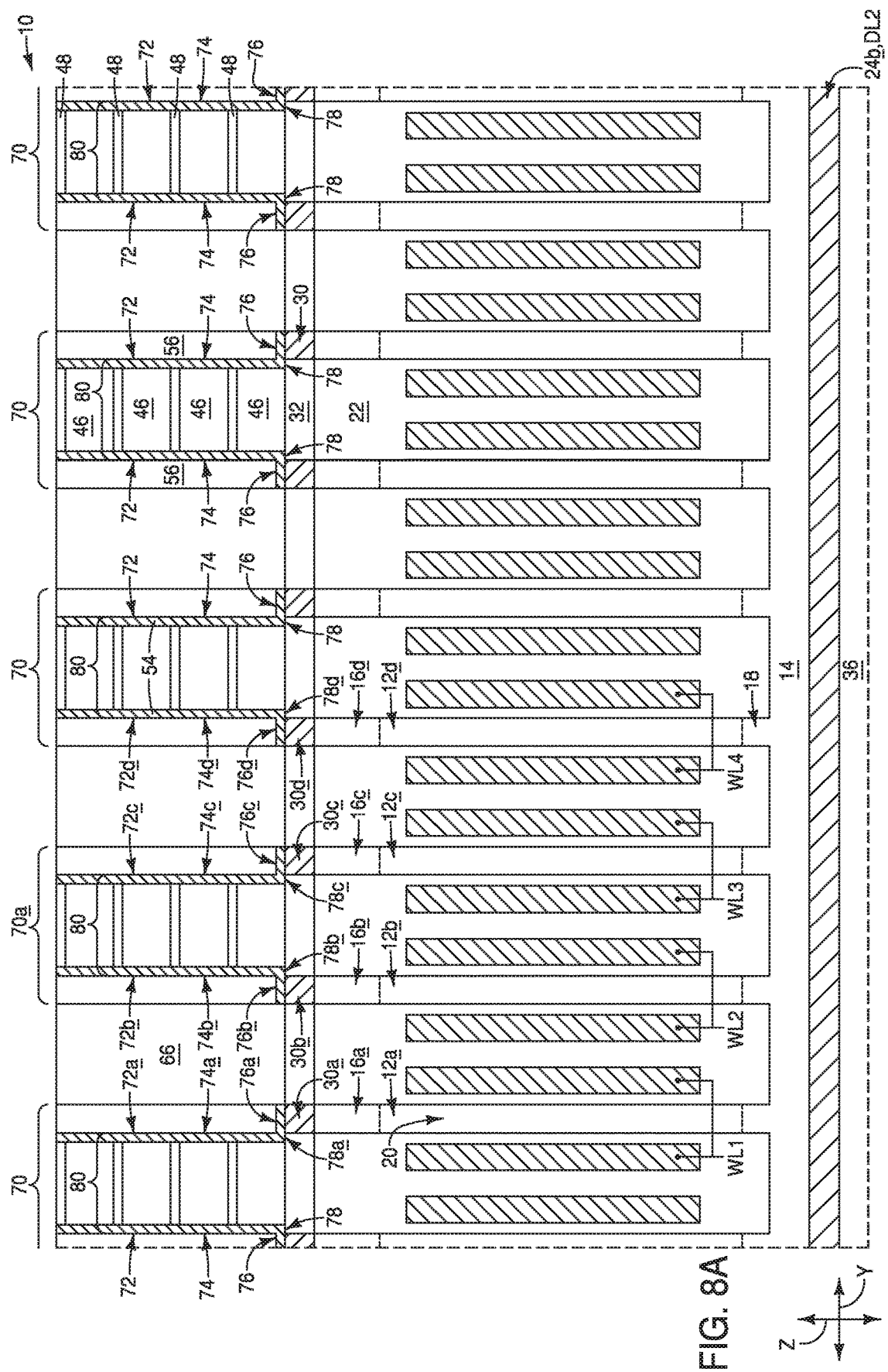
Figure 8B:
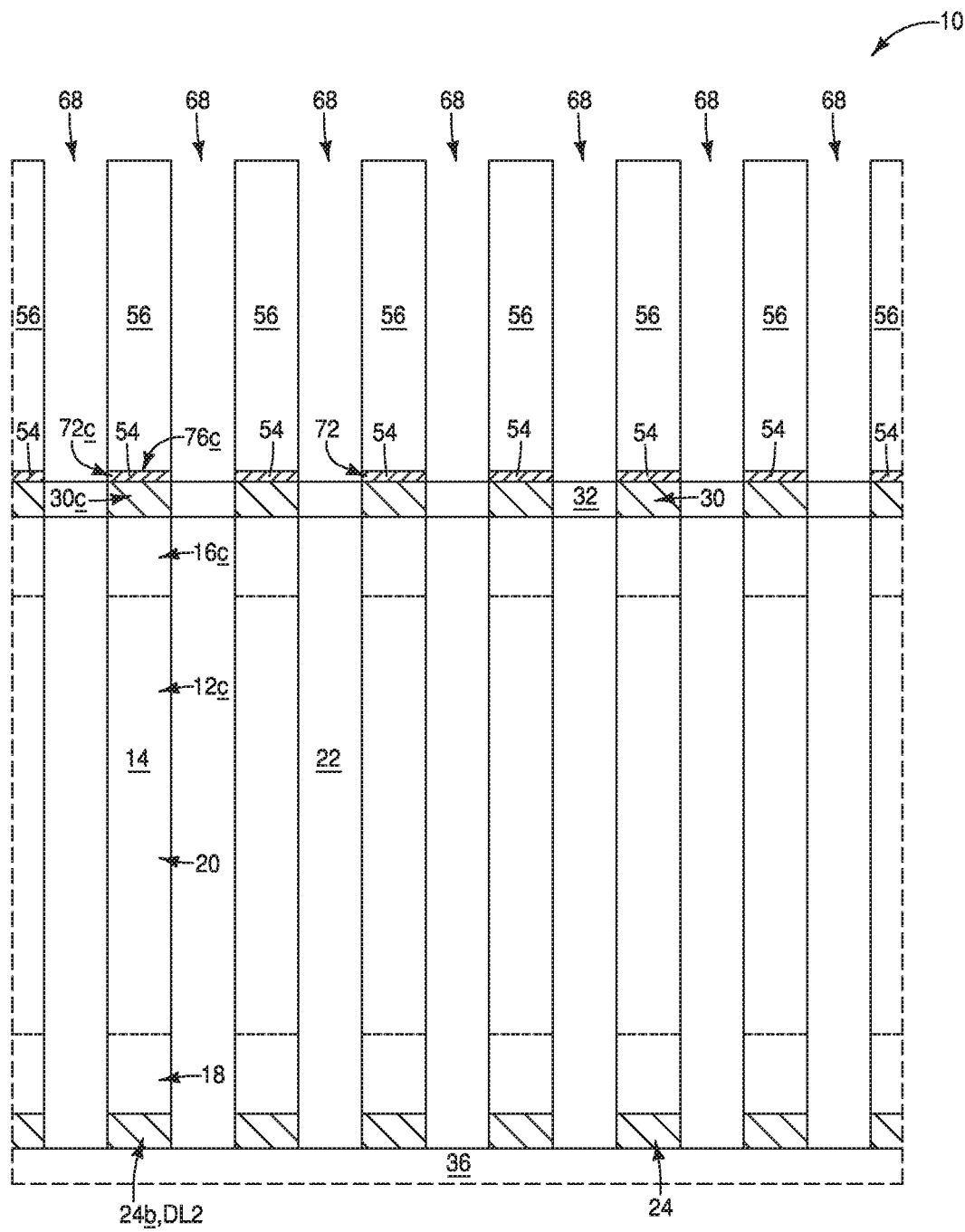

Referring to FIGS. 8-8B, trenches 68 are formed to extend along the y-axis direction (i.e., the same direction as the digit lines 24). The trenches 68 may be referred to as third trenches to distinguish them from the first and second trenches 52 and 58 described above. The trenches 68 subdivide the beams 60 (FIGS. 7-7B) into beam segments 70. The subdivided angle plates 62 (FIGS. 7-7B) are bottom electrodes 72. Four of the bottom electrodes are labeled as 72a, 72b, 72c and 72d so that they may be distinguished relative to one another, and relative to the other bottom electrodes.

Each of the bottom electrodes has a substantially vertical segment 74, and a substantially horizontal segment 76. The term "substantially vertical" means vertical to within reasonable tolerances of fabrication and measurement, and the term "substantially horizontal" means horizontal to within reasonable tolerances of fabrication and measurement. The illustrated vertically-extending segments 74 are approximately orthogonal to the illustrated horizontally-extending segments 76, with the term "approximately orthogonal" meaning within about 10° of orthogonal. The horizontally-extending segments 76 join to the vertically-extending segments 74 at corners 78.

Each of the horizontally-extending segments 76 is coupled with an associated one of the electrical nodes 30. For instance, in the shown embodiment some of the horizontally-extending segments 76 are labeled as 76a, 76b, 76c and 76d. The segment 76a is coupled with an associated electrical node 30a, the segment 76b is coupled with an associated electrical node 30b, the segment 76c is coupled with an associated electrical node 30c, and the segment 76d is coupled with an associated electrical node 30d. Also, four of the vertically-extending segments 74 are labeled as 74a, 74b, 74c and 74d; and such vertically-extending segments are joined with the horizontally-extending segments 76a, 76b, 76c and 76d, respectively, at corners 78a, 78b, 78c and 78d.

Each of the beam segments 70 comprises a pair of the bottom electrodes 72, and comprises a rail segment 80 between the pair of bottom electrodes. For instance, one of the beam segments is labeled as 70a, and such comprises the bottom electrodes 72b and 72c.

Figure 9:
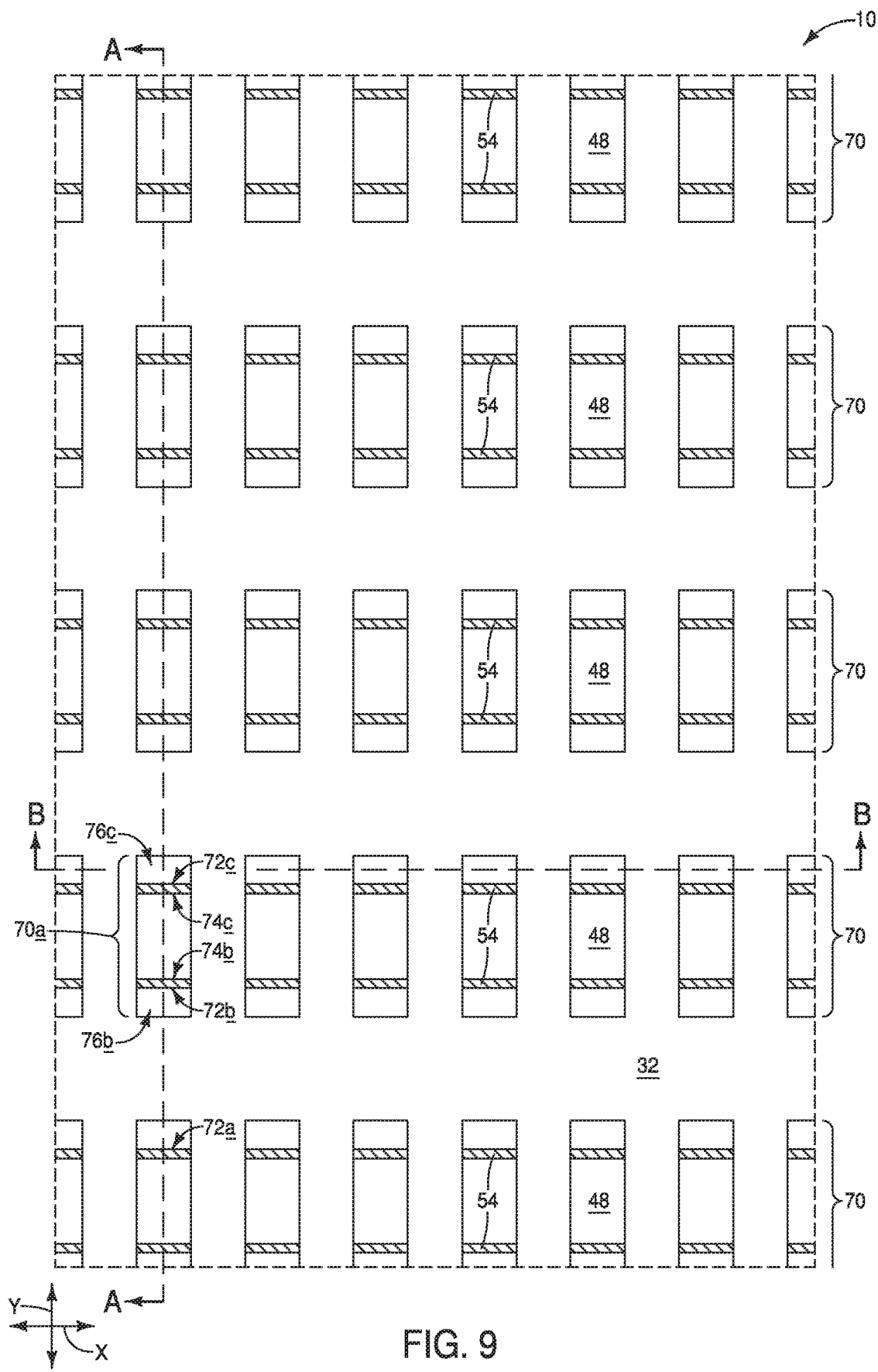
FIGS. 9-9C are diagrammatic views of the region of FIGS. 1-1B at an example process stage following that of FIGS. 8-8B.
Figure 9A:
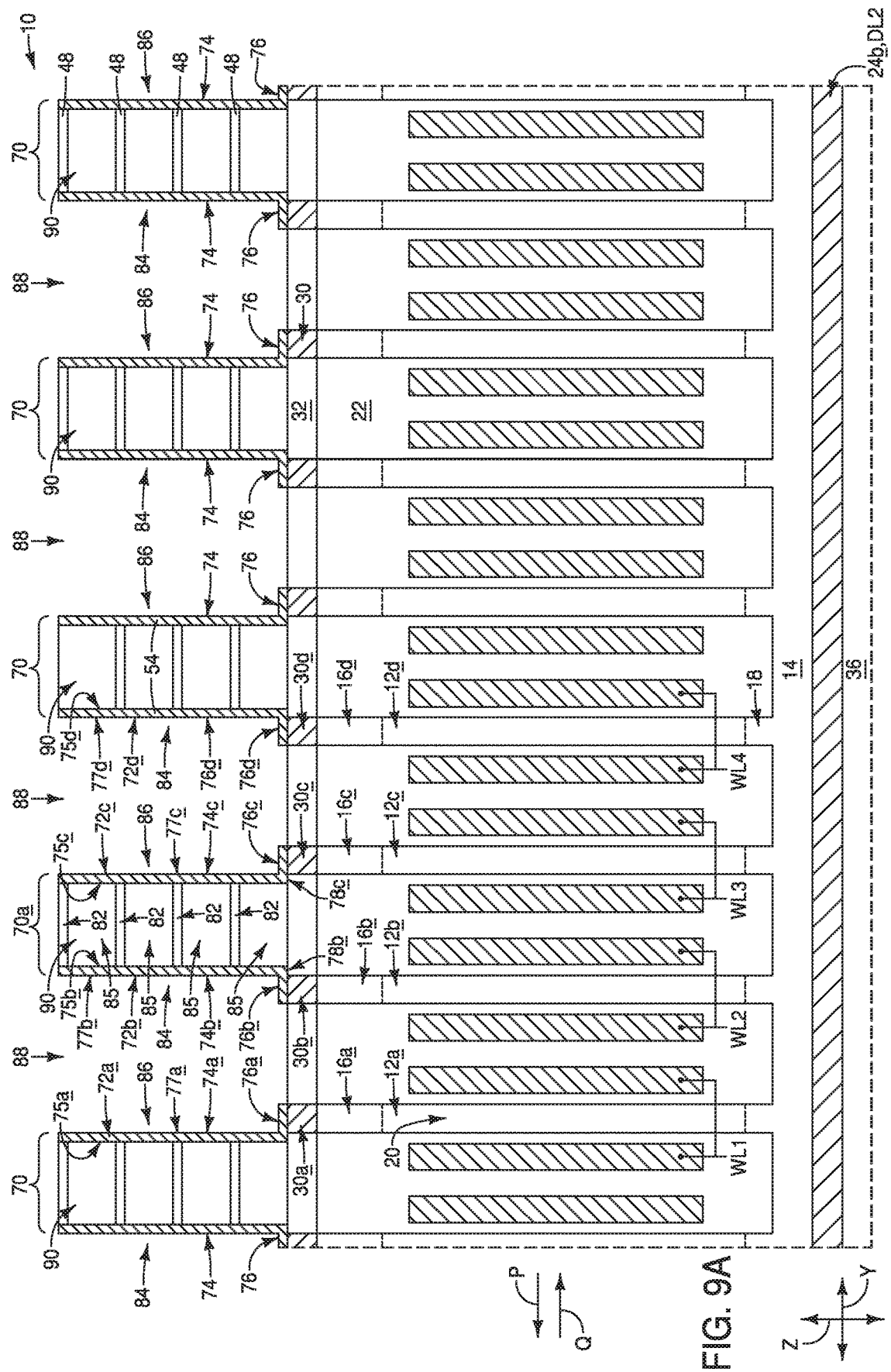
FIGS. 9A and 9B are cross-sectional side views along the lines A-A and B-B, respectively, of FIG. 9.
Figure 9B:
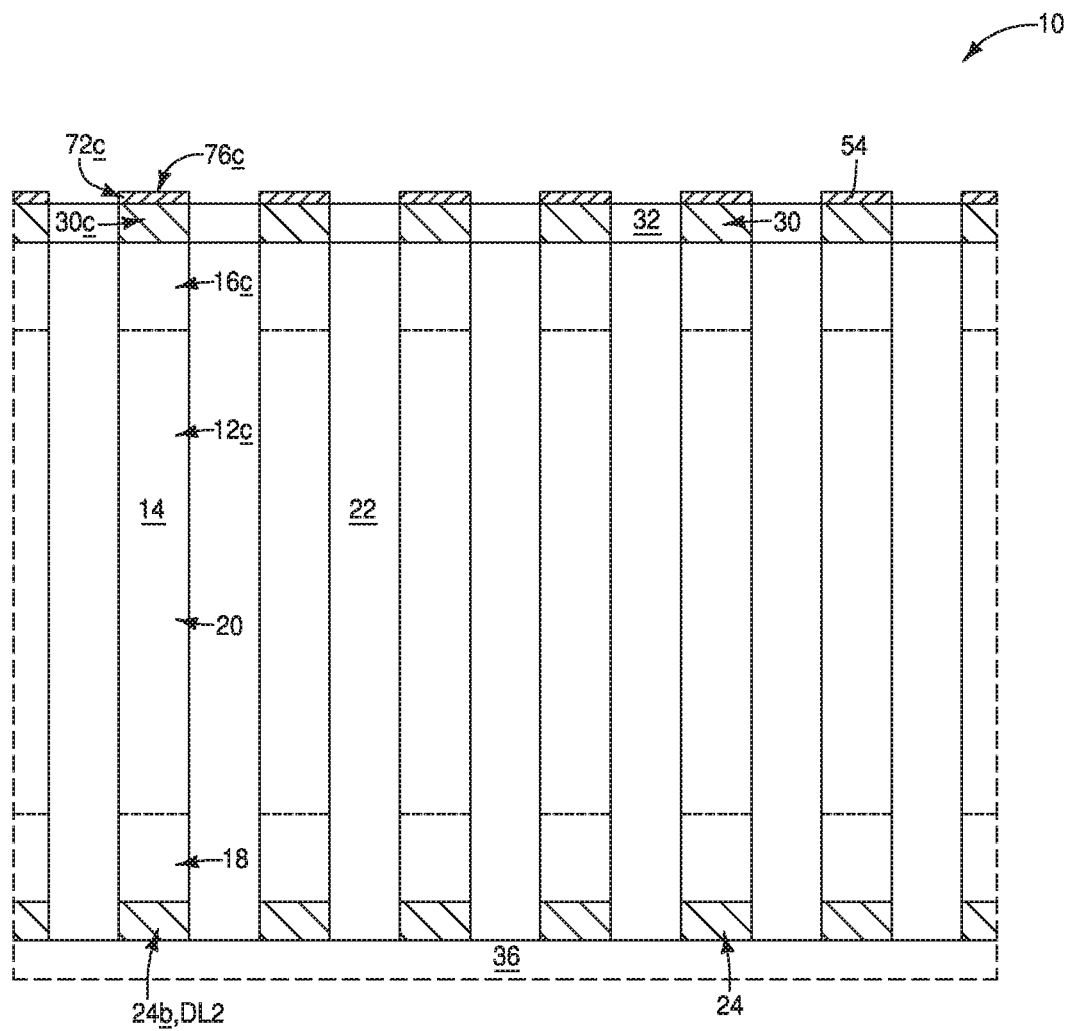

Referring to FIGS. 9-9B, the spacer material 56 (FIGS. 8-8B), first sacrificial material 46 (FIGS. 8-8B) and second sacrificial material 66 (FIGS. 8-8B) are removed. The remaining beam segments 70 each comprise vertically-spaced scaffold structures 82, with such scaffold structures comprising the scaffold material 48. Voids (intervening spaces) 85 are between the vertically-stacked scaffold structures 82. The scaffold structures 82 provide support to the paired bottom electrodes 72 within the remaining beam segments 70. For instance, the scaffold structures 82 provide support to the paired bottom electrodes 72b and 72c within the beam segment 70a.

In some embodiments, the nodes 30 may be considered to be laterally spaced along the cross-section of FIG. 9A. The bottom electrodes 72 are coupled with the nodes 30. Each of the bottom electrodes may be considered to have a first leg 76 and a second leg 74, with the second legs 74 being substantially orthogonal to the first legs 76.

Individual bottom electrodes 74 may be considered to be neighboring with other bottom electrodes which are directly adjacent to the individual bottom electrodes. Accordingly, each of the bottom electrodes 74 along the cross-section of FIG. 9A is neighboring with two others of the bottom electrodes. For instance, the bottom electrode 72b is neighboring with the electrodes 72a and 72c. First gaps 88 may be defined to be between the first legs 76 of the neighboring bottom electrodes 74, and second gaps 90 may be defined to be between the second legs 74 of the neighboring bottom electrodes. For instance, a first gap 88 is between the neighboring electrodes 72a and 72b since it is the first legs 76 (specifically, 76a and 76b) of such electrodes which are adjacent to one another, and a second gap 90 is between the neighboring electrodes 72b and 72c since it is the second legs 74 (specifically, 74b and 74c) of such electrodes which are adjacent to one another. The scaffold structures 82 are within the second gaps 90 and are not within the first gaps 88.

A first set of the bottom electrodes 72 along the cross-section of FIG. 9A may correspond to the electrodes having the first legs 76 projecting from the second legs 74 in a first direction P along the cross-section of FIG. 9A, and a second set of the bottom electrodes 72 may correspond to the electrodes having the legs 76 extending in a second direction Q along the cross-section of FIG. 9A; with the second direction Q being opposite to the first direction P. The electrodes 72 of the first set are labeled as electrodes 84, and the electrodes 72 of the second set are labeled as electrodes 86. The electrodes 84 alternate with the electrodes 86 along the cross-section of FIG. 9A. Each of the beam segments 70 comprises one of the electrodes 84 and one of the electrodes 86.

In some embodiments, the electrical nodes 30b and 30c may be referred to as first and second electrical nodes, respectively. The first and second electrical nodes 30b and 30c are laterally adjacent to one another. The electrode 72b may be referred to as a first conductive structure which is electrically coupled with the first electrical node 30b, and the electrode 72c may be referred to as a second conductive structure which is electrically coupled with the second electrical node 30c. The first conductive structure 72b comprises a first substantially horizontal leg 76b over the first electrical node 30b, and comprises a first substantially vertical leg 74b joining to the first substantially horizontal leg at a corner 78b. The second conductive structure 72c comprises a second substantially horizontal leg 76c over the second electrical node 30c, and comprises a second substantially vertical leg 74c joining to the second substantially horizontal leg at another corner 78c.

The first substantially vertical leg 74b has a first inner edge 75b in opposing relation to the substantially horizontal leg 76b, and the second substantially vertical leg 74c has a second inner edge 75c in opposing relation to the substantially horizontal leg 76c. Also, the first substantially vertical leg 74b has a first outer edge 77b in opposing relation to the first inner edge 75b and directly over the first substantially horizontal leg 76b; and the second substantially vertical leg 74c has a second outer edge 77c in opposing relation to the second inner edge 75c and directly over the second substantially horizontal leg 76c.

The first and second inner edges 75b and 75c face one another along the cross-section of FIG. 9A, with the gap 90 being between the first and second inner edges 75b and 75c.

The scaffold layers 82 are between the inner edges 75b and 75c. In the shown embodiment there are four of the scaffold layers 82. Any suitable number of scaffold layers may be utilized to provide desired support between the adjacent electrodes 72b and 72c. Generally, there will be at least two of the scaffold layers.

Figure 9C:
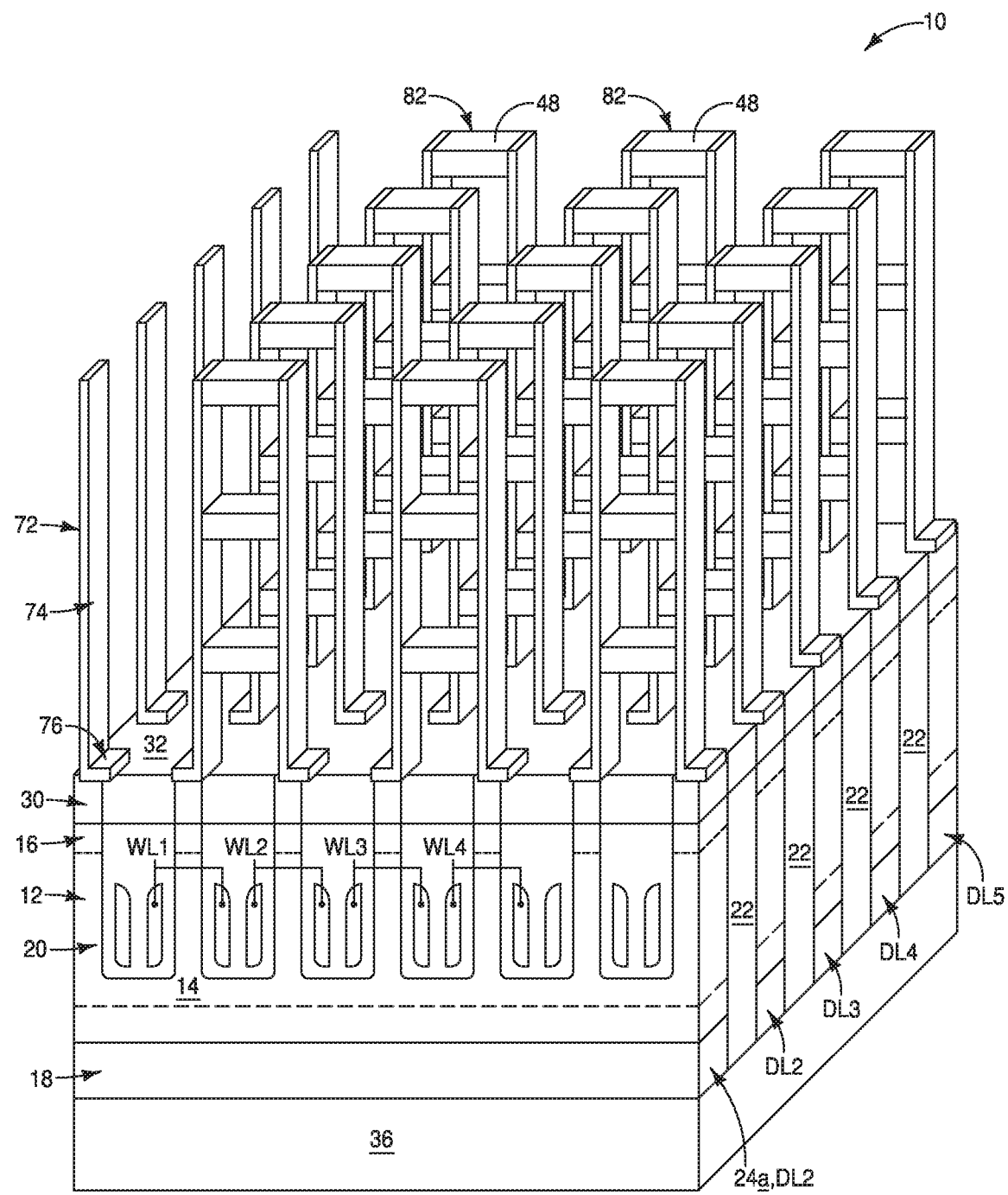

FIG. 9C shows a three-dimensional view of the integrated assembly 10 at the process stage of FIGS. 9-9B to assist the reader in understanding various structural relationships associated with such assembly. Cross-hatching is not shown in FIG. 9C to simplify the drawing.

The assembly 10 of FIG. 9C only comprises three vertically-spaced layers of the scaffold material 48, rather than the four layers shown in FIGS. 9A and 9B. It is to be understood that the assembly 10 may comprise any suitable number of layers of the scaffold material 48; including four layers as shown in FIGS. 9A and 9B, three layers as shown in FIG. 9C, two layers, five layers, 10 layers, etc.

Figure 10:
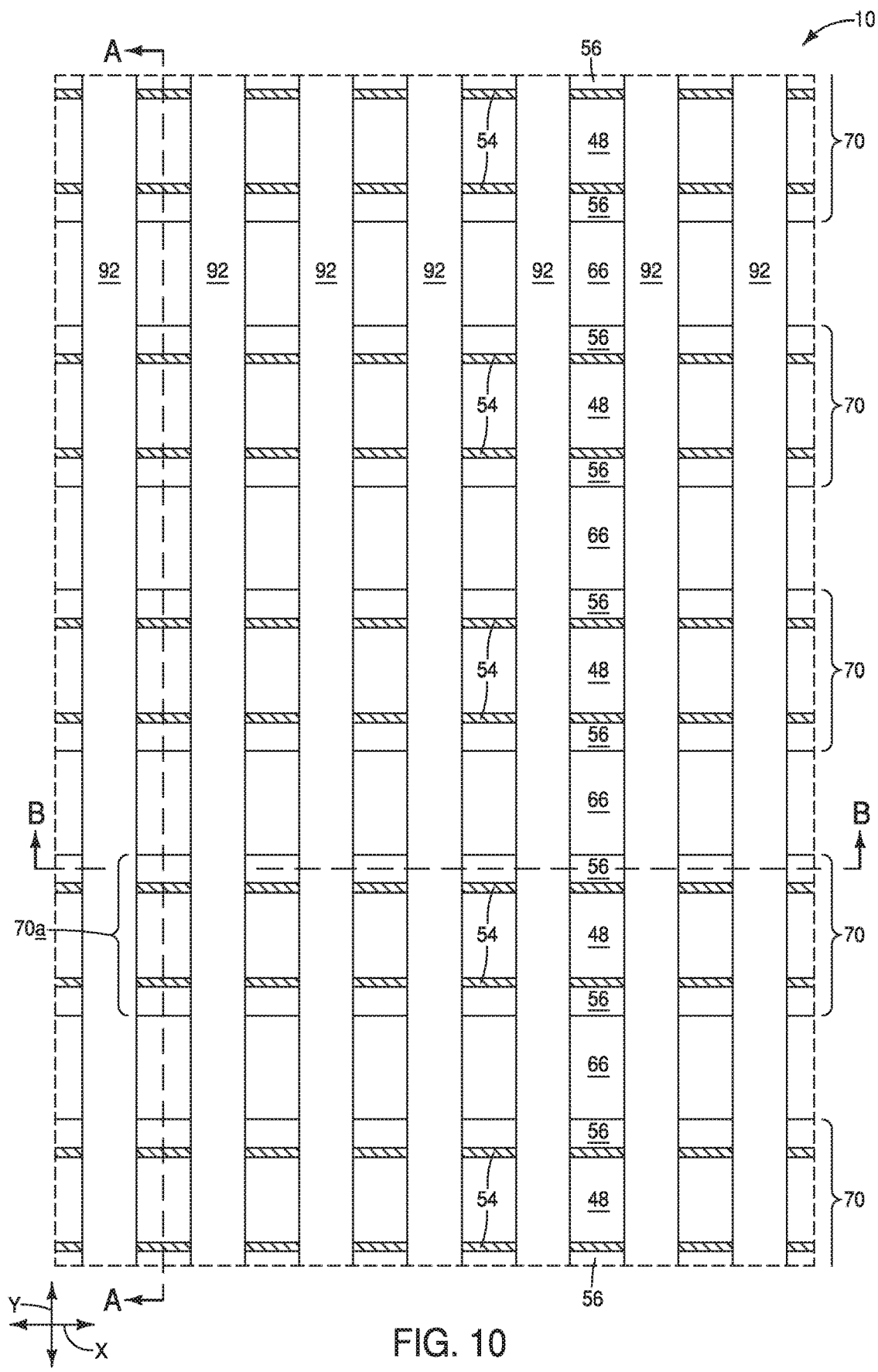
FIGS. 10-10D are diagrammatic views of the region of FIGS. 1-1B at an example process stage following that of FIGS. 8-8B and alternative to that of FIGS. 9-9C.
Figure 10A:
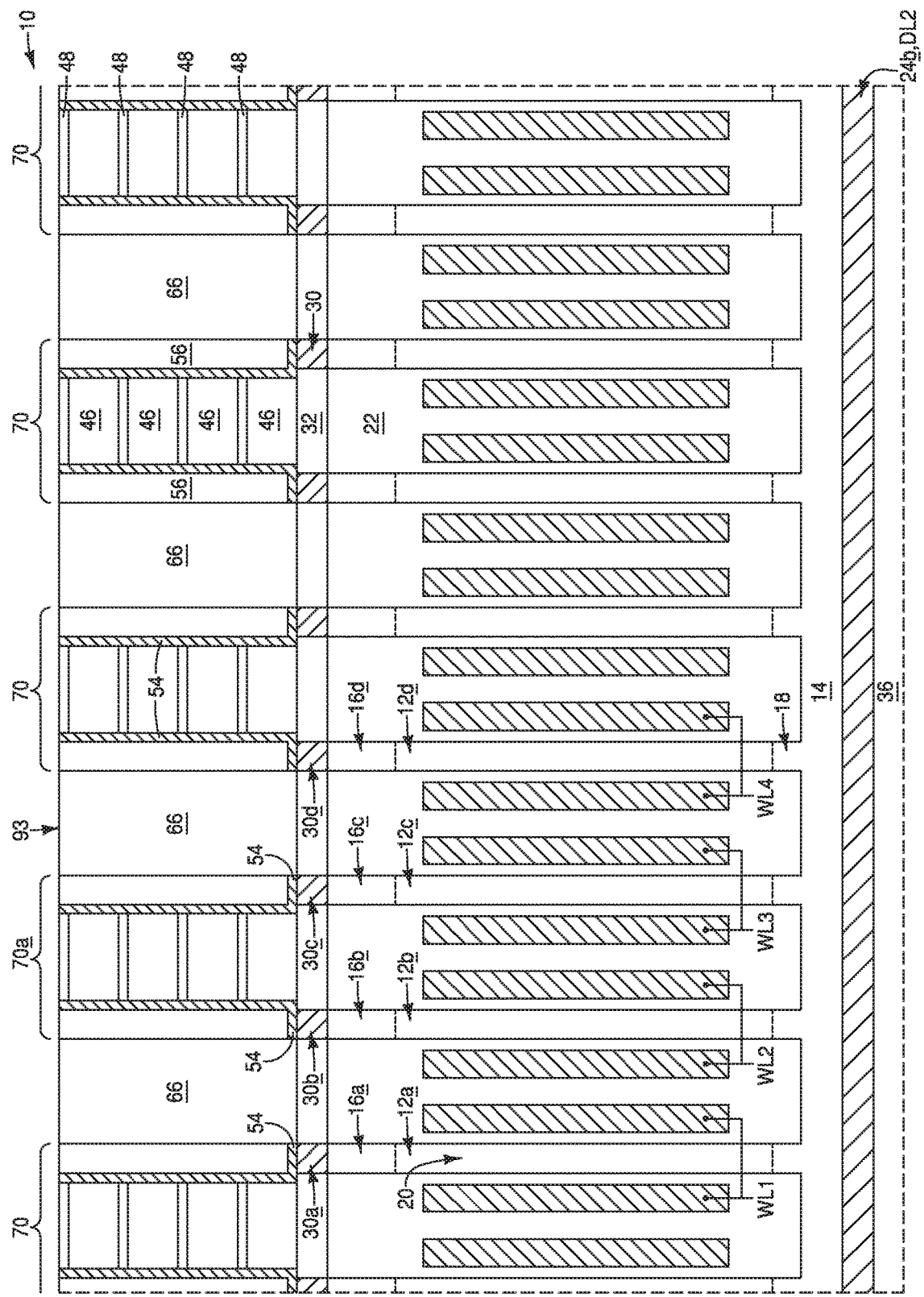
FIGS. 10A and 10B are cross-sectional side views along the lines A-A and B-B, respectively, of FIG. 10.
Figure 11:
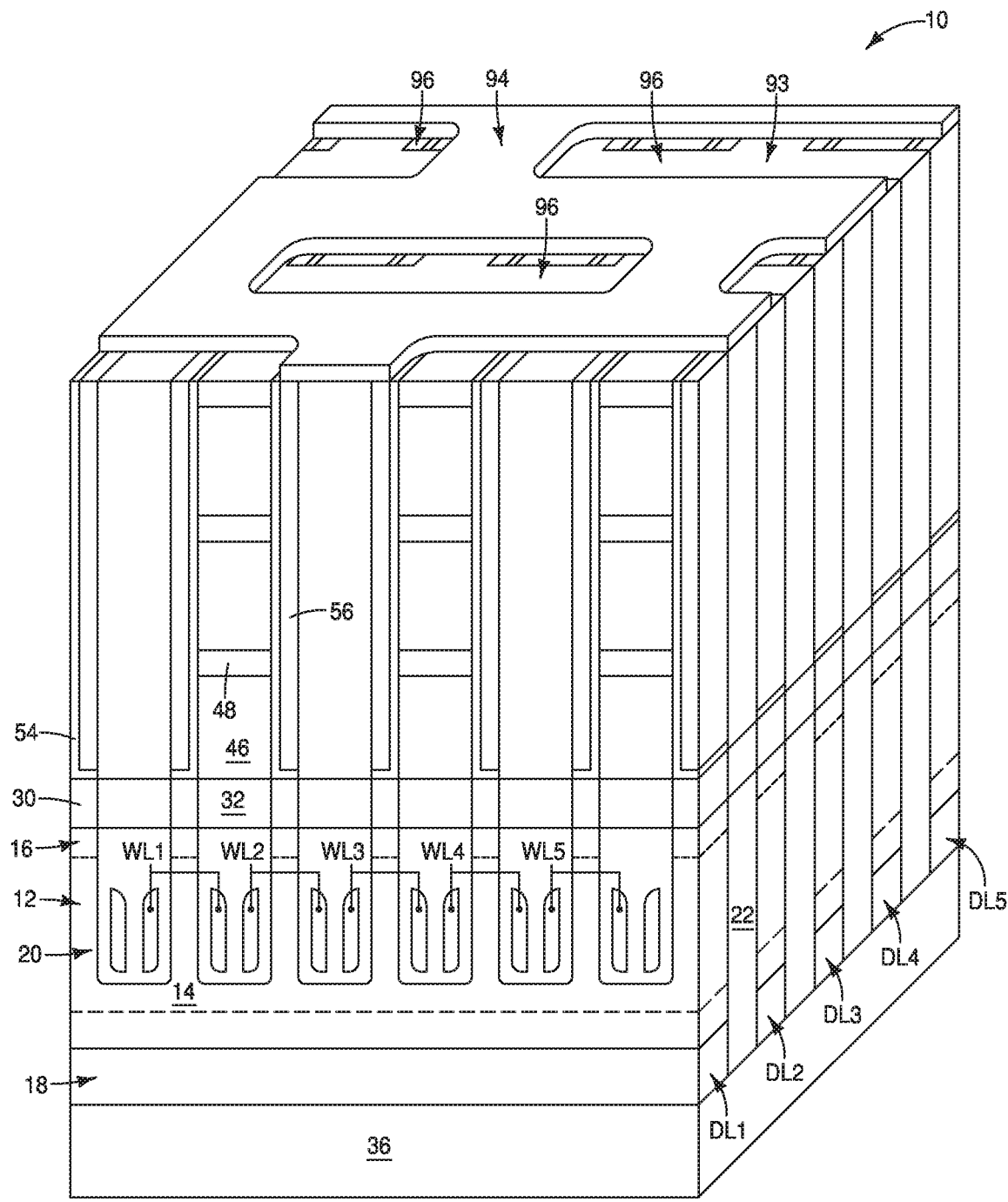
FIG. 11 is a diagrammatic three-dimensional view of the region of FIG. 10D at an example process stage following that of FIG. 10D.
Figure 12:
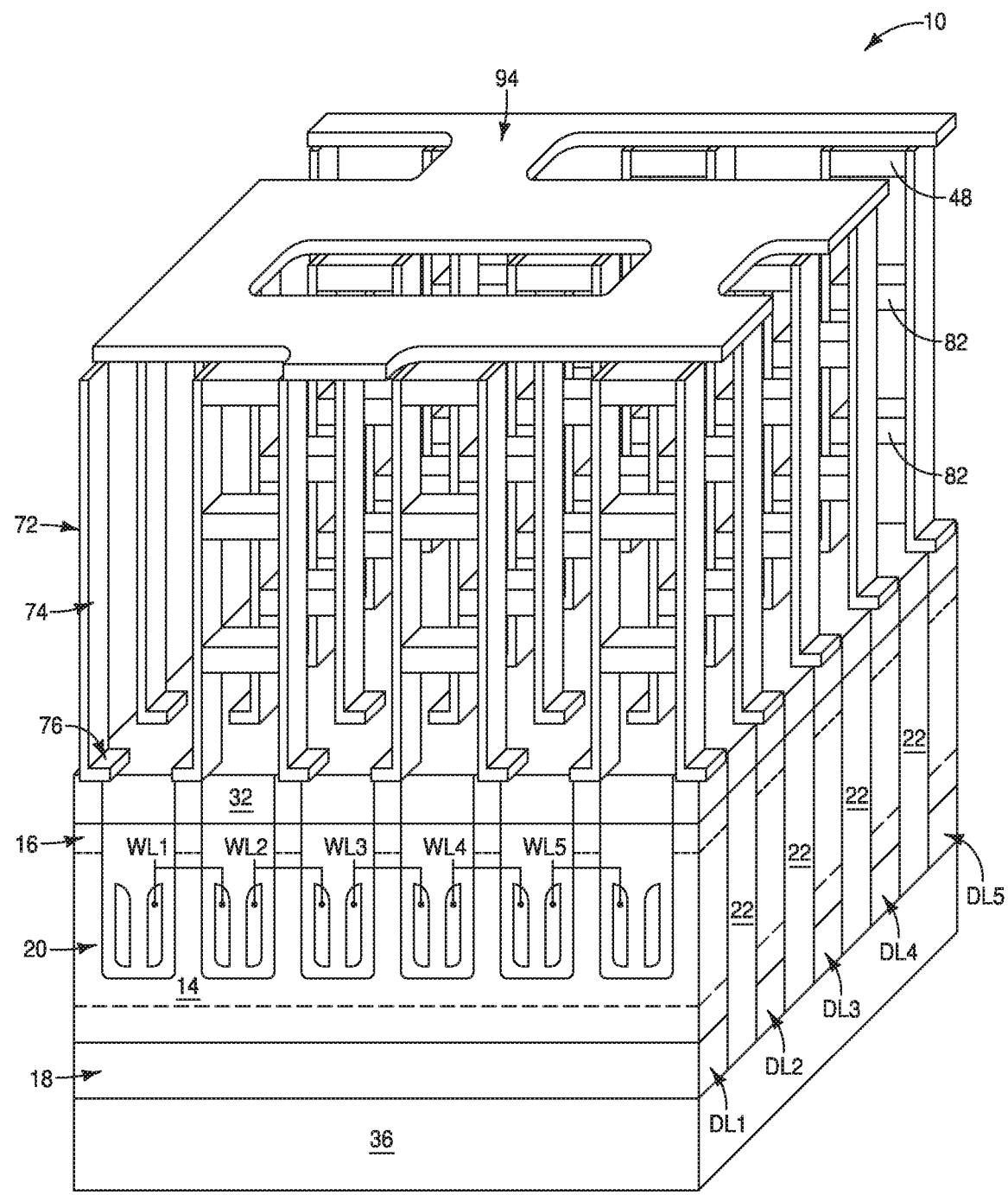
FIG. 12 is a diagrammatic three-dimensional view of the region of FIG. 10D at an example process stage following that of FIG. 11.

In some embodiments it may be desired to provide additional support for the upper regions of the electrodes 72 besides that shown in FIGS. 9-9C. FIGS. 10-12 describe example processing which may be utilized to provide the additional support.

Figure 10B:
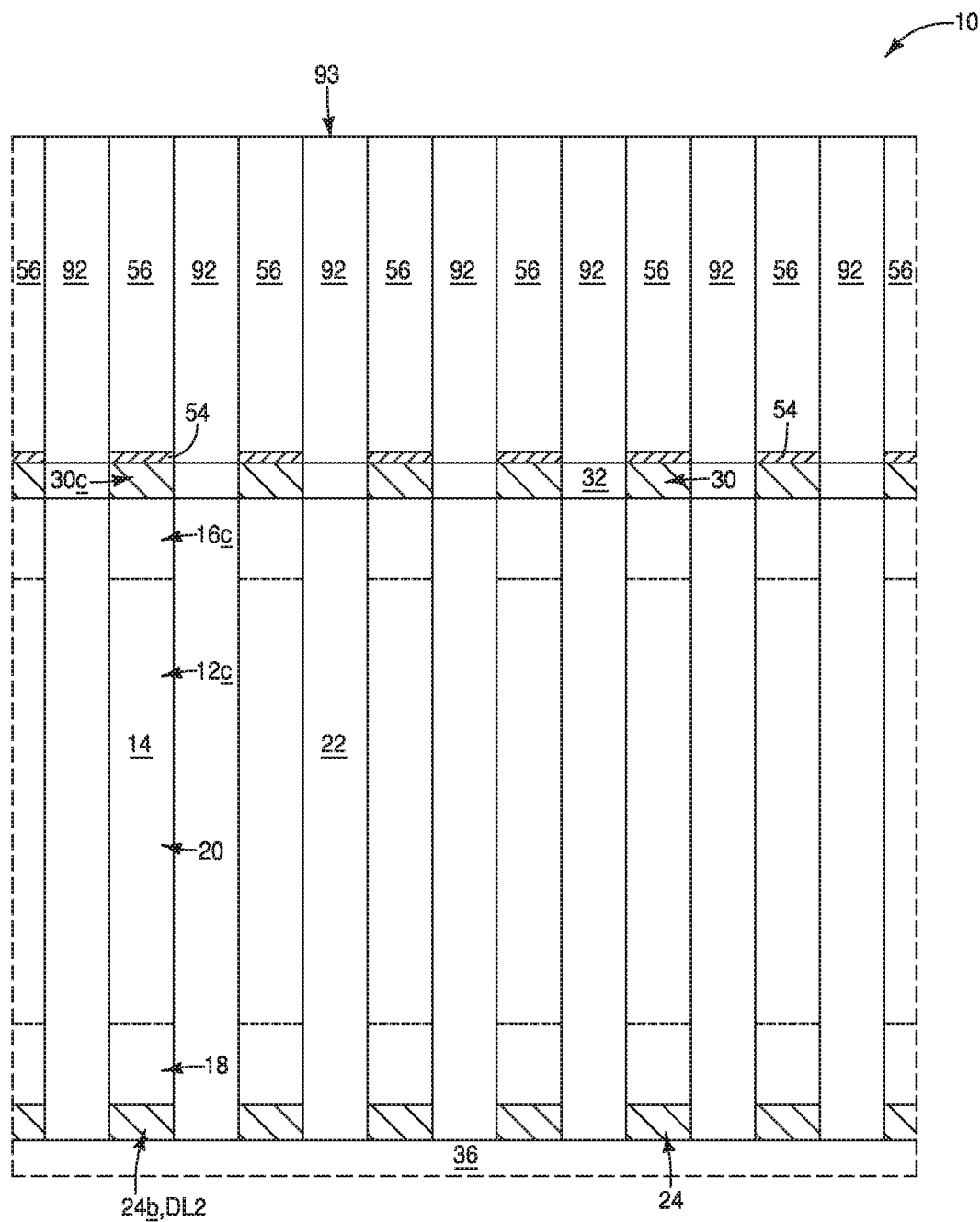
Figure 10C:
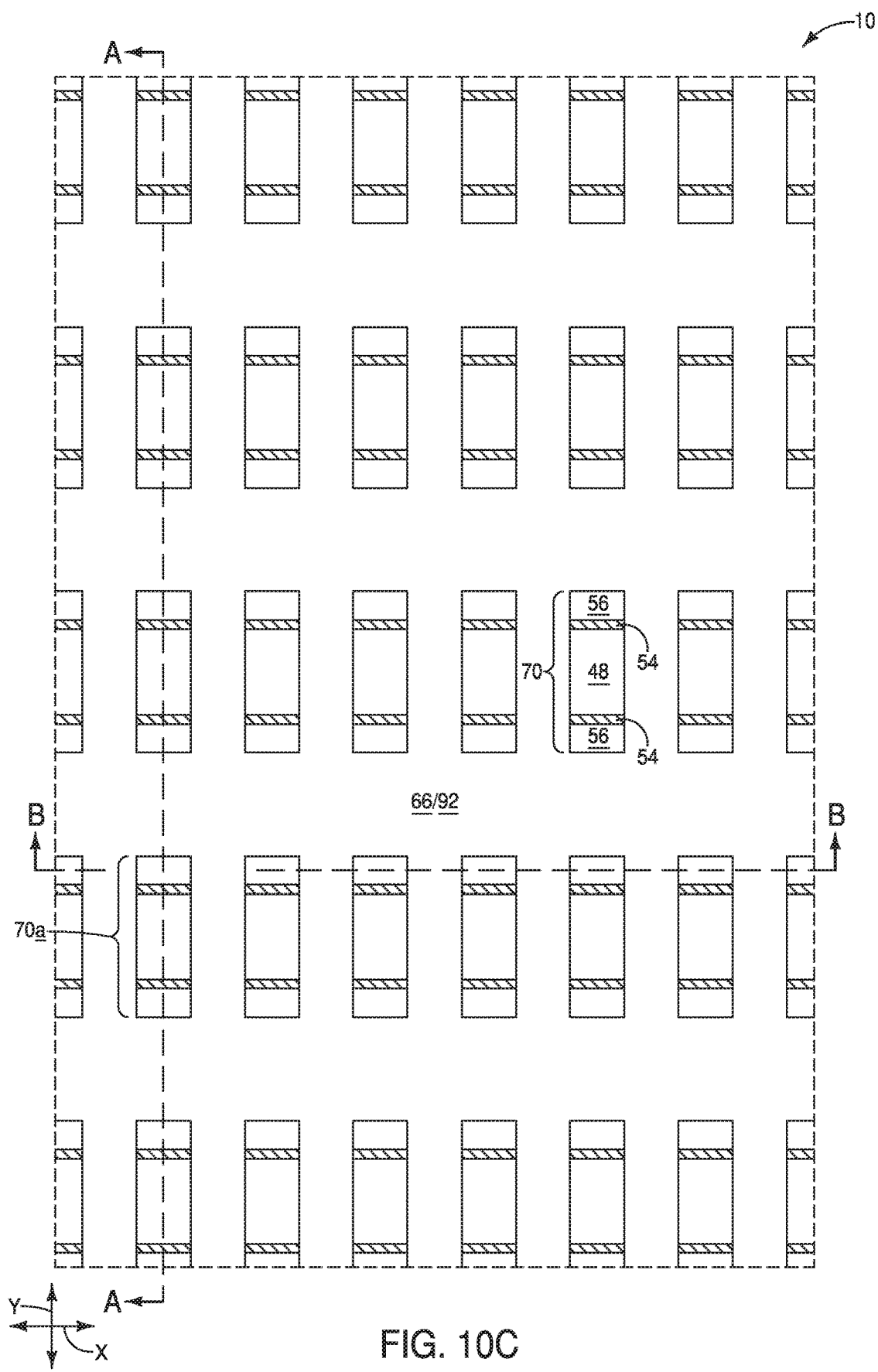
FIG. 10C is an alternative top view analogous to that of FIG. 10.
Figure 10D:
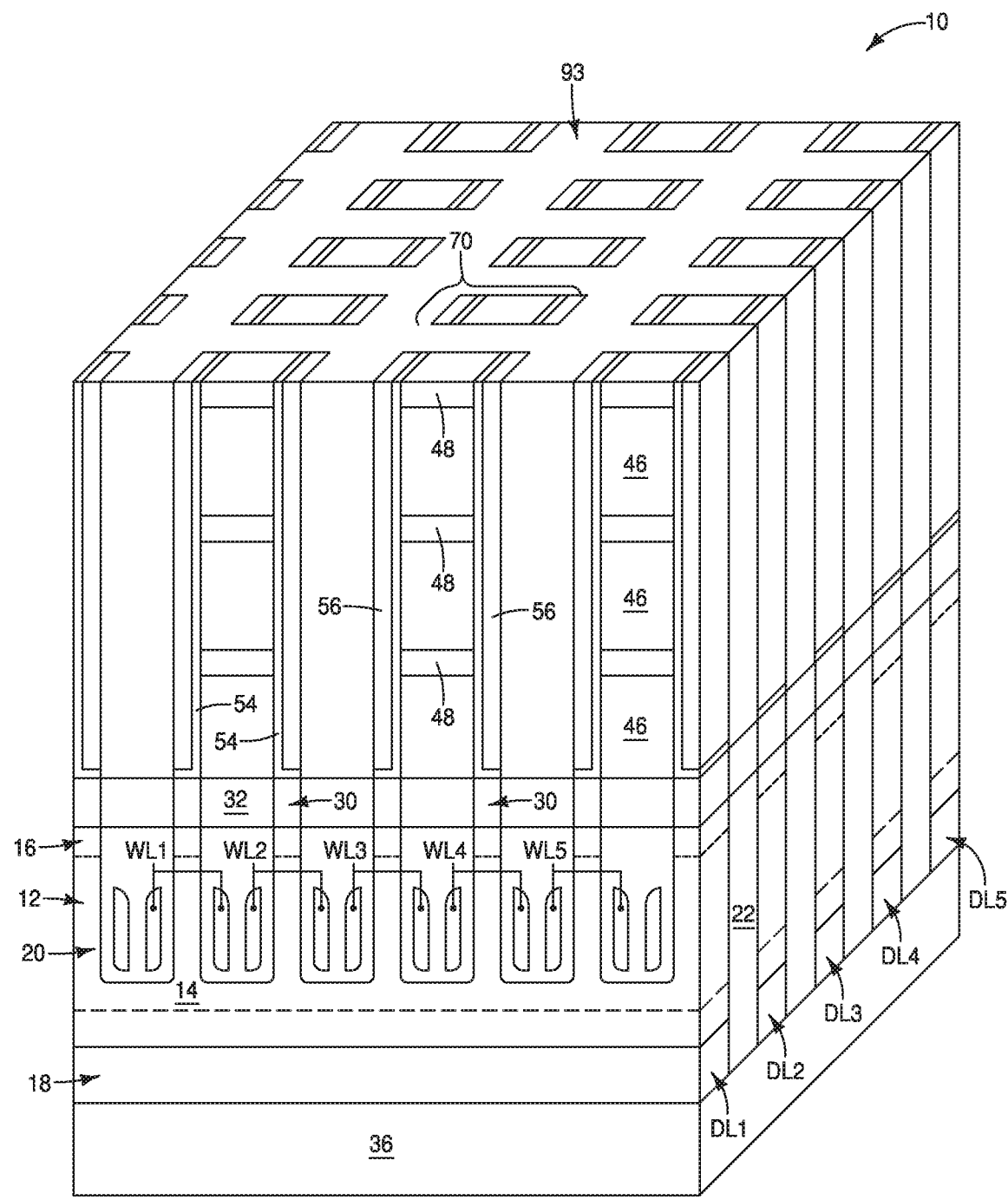

Referring to FIGS. 10-10B, the assembly 10 is shown at an example process stage which may follow that of FIGS. 8-8B. Insulative material 92 is formed within the trenches 68 (FIGS. 8-8B), and a planarized surface 93 is formed across the materials 48, 54, 56, 66 and 92. The insulative material 92 may comprise any suitable composition(s); and in some embodiments may comprise one or both of silicon dioxide and carbon. The silicon dioxide may be doped (e.g., may comprise one or more of borophosphosilicate glass, phosphosilicate glass, fluorosilicate glass, etc.). In some embodiments, the materials 66 and 92 may comprise a same composition as one another. An example of such embodiments is shown in the top view of FIG. 10C, where the materials 66 and 92 are merged into a single material 66/92. FIG. 10D shows a three-dimensional view of the integrated assembly 10 at the process stage of FIG. 10C to assist the reader an understanding various structural relationships associated with the assembly. Cross-hatching is not shown in FIG. 10D to simplify the drawing.

Referring to FIG. 11, the assembly 10 is shown at a process stage following that of FIG. 10D. A protective strap 94 is formed on the planarized surface 93, and is formed across the beam segments 70. The strap 94 has openings 96 penetrating therethrough. The strap 94 may comprise any suitable composition(s); and in some embodiments may comprise, consist essentially of, or consist of silicon nitride. In some embodiments, the strap 94 may comprise a same composition as the scaffold material 48. In other embodiments, the strap 94 may comprise a different composition relative to the scaffold material 48.

Referring to FIG. 12, the materials 46, 56 and 66/92 are removed with processing analogous to that described above with reference to FIGS. 9-9C. The protective strap 94 may provide additional support to tops of the bottom electrodes 74, which may be desired in some applications to alleviate toppling.

Figure 13:
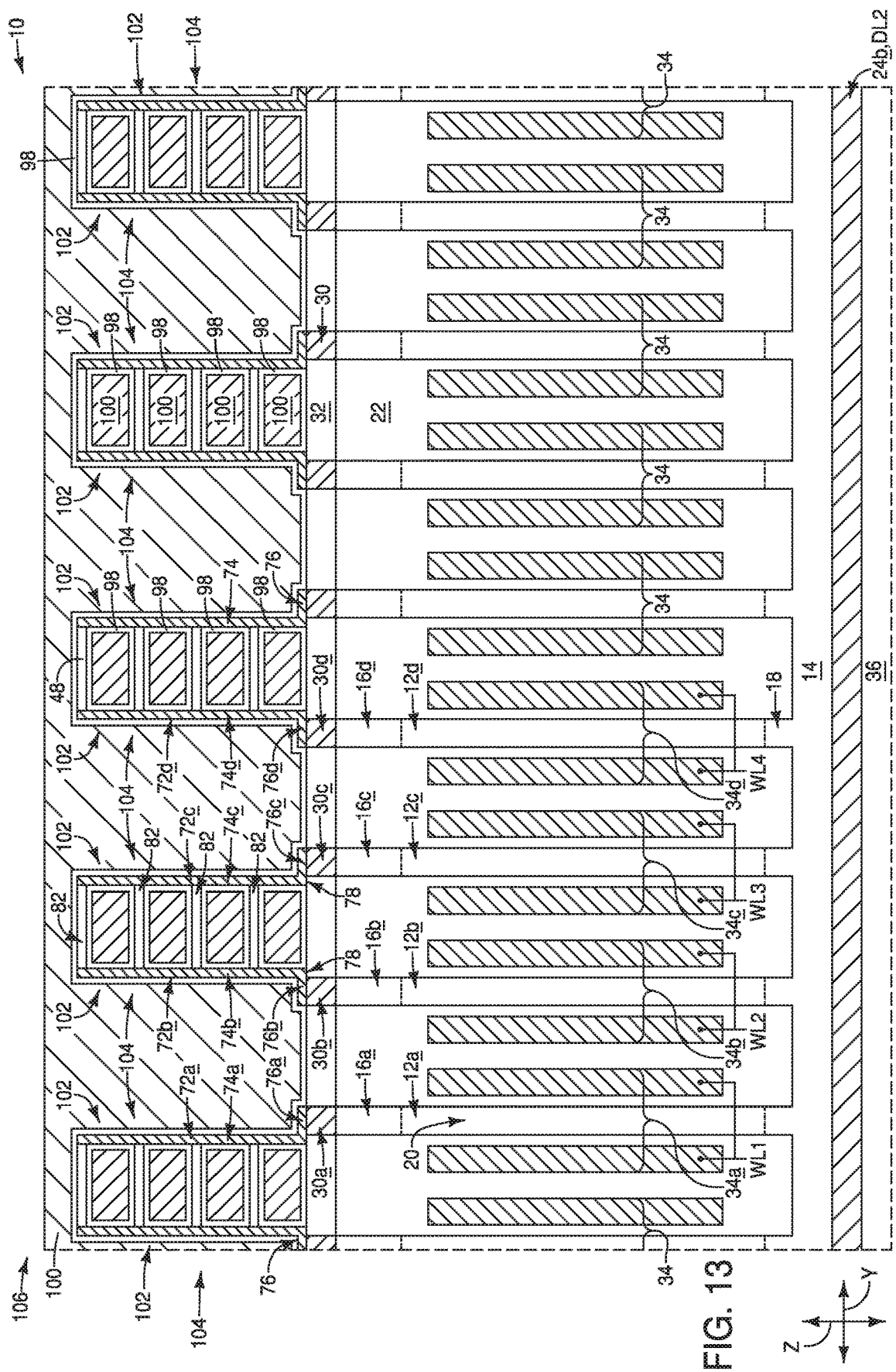
FIG. 13 is a diagrammatic cross-sectional side view of the region of FIG. 9A at a process stage subsequent to that of FIG. 9A.

The bottom electrodes 72 of FIGS. 9 and 12 may be incorporated into capacitors. For instance, FIG. 13 shows assembly 10 at a process stage which may follow that of FIG. 9A. Insulative material 98 is formed along the electrodes 72, and conductive-plate-material 100 is formed over the insulative material 98. In the shown embodiment, the insulative material 98 and conductive-plate-material 100 are also formed within the voids 85 (FIG. 9A) between the vertically-stacked scaffold structures 82.

The insulative material 98 may comprise any suitable composition(s). In some embodiments, the insulative material 98 may be non-ferroelectric (e.g., may comprise, consist essentially of, or consist of silicon dioxide, silicon nitride, aluminum oxide, etc.). In some embodiments, the insulative material 98 may be ferroelectric. The ferroelectric-insulative-material may comprise any suitable composition or combination of compositions; and in some example embodiments may include one or more of transition metal oxide, zirconium, zirconium oxide, niobium, niobium oxide, hafnium, hafnium oxide, lead zirconium titanate, and barium strontium titanate. Also, in some example embodiments the ferroelectric-insulative-material may have dopant therein which comprises one or more of silicon, aluminum, lanthanum, yttrium, erbium, calcium, magnesium, strontium, and a rare-earth element.

The bottom electrodes 72, insulative material 98 and conductive-plate-material 100 together form capacitors 102. The bottom electrodes 72 of the capacitors are electrically coupled with the upper source/drain regions 16 of the access transistors 34 through the electrodes 30. The capacitors 102 may be considered to be comprised by memory cells 104 of a memory array 106. The memory array may be a DRAM array if the insulative material 98 is non-ferroelectric, and may be a FeRAM array if the insulative material 98 is ferroelectric (or if at least a portion of the insulative material 98 is ferroelectric).

The memory array 106 may comprise any suitable configuration. An example DRAM array 106 is shown schematically in FIG. 14, and an example FeRAM array 106 is shown schematically in FIG. 15.

Figure 14:
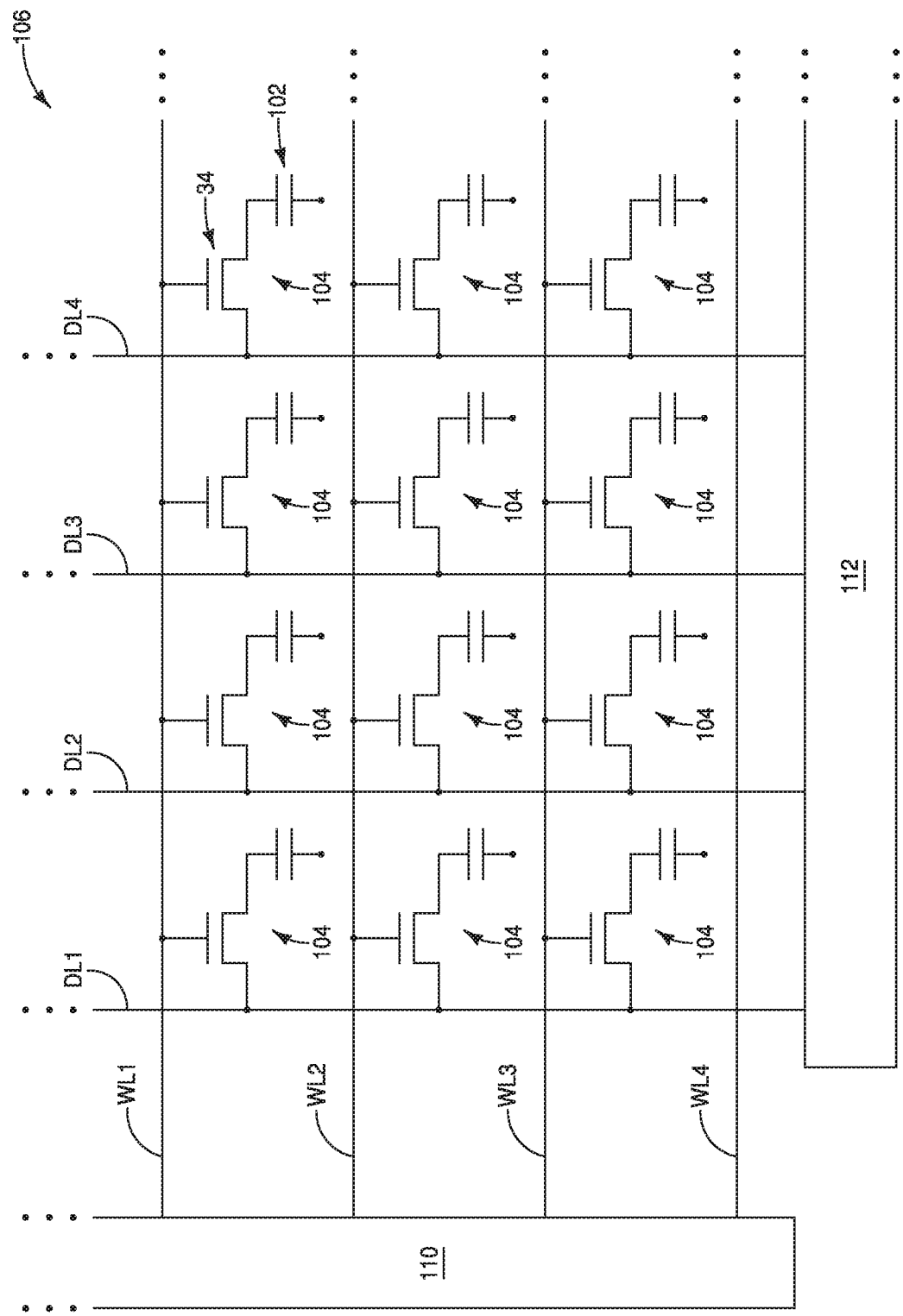
FIG. 14 is a schematic diagram of an example memory array.

Referring to FIG. 14, the memory array 106 includes a plurality of substantially identical memory cells 104, with each of the memory cells including a transistor 34 and a non-ferroelectric capacitor 102. Wordlines WL1-WL4 extend along rows of the memory array, and digit lines DL1-DL4 extend along columns of the memory array. Each of the memory cells 104 is uniquely addressed utilizing a combination of a wordline and a digit line. The wordlines extend to driver circuitry 110, and the digit lines extend to detecting (sensing) circuitry 112. The driver circuitry 110 may comprise wordline-driver-circuitry, and the sensing circuitry 112 may comprise sense-amplifier-circuitry. The circuitries 110 and 112 may be together comprised by logic circuitry.

Figure 15:
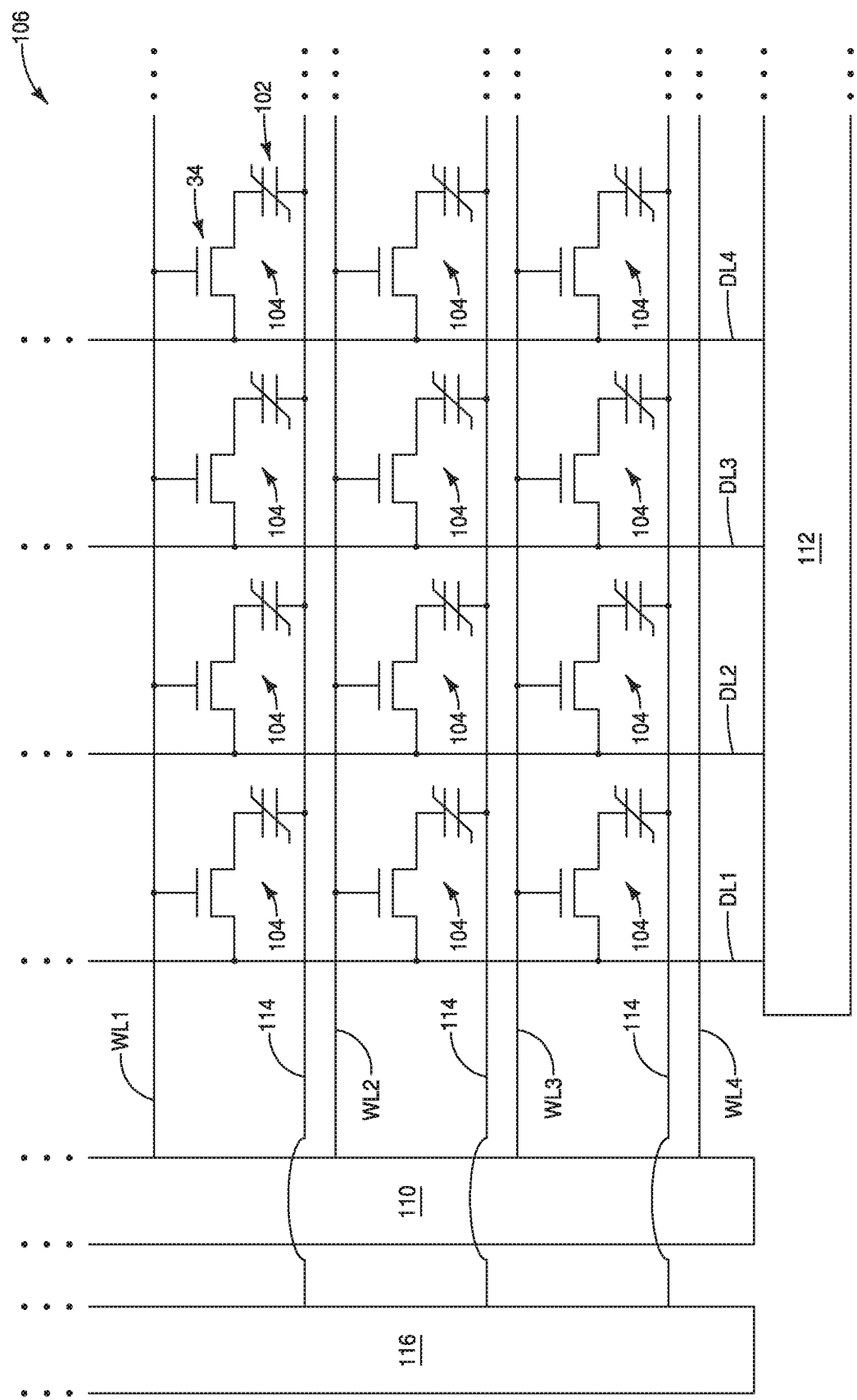
FIG. 15 is a schematic diagram of another example memory array.

Referring to FIG. 15, the FeRAM array 106 includes a plurality of memory cells 104 comprising ferroelectric capacitors 102 and access transistors 34. The wordlines WL1-WL4 extend along the rows of the memory array, and the digit lines DL1-DL4 extend along columns of the memory array. Each of the memory cells 104 is uniquely addressed utilizing a combination of a wordline and a digit line. The wordlines extend to the driver circuitry 110, and the digit lines extend to the detecting (sensing) circuitry 112. In the illustrated embodiment, the top electrodes of the ferroelectric capacitors 102 are shown coupled with plate lines 114 which extend to an appropriate reference source 116.

Figure 16:
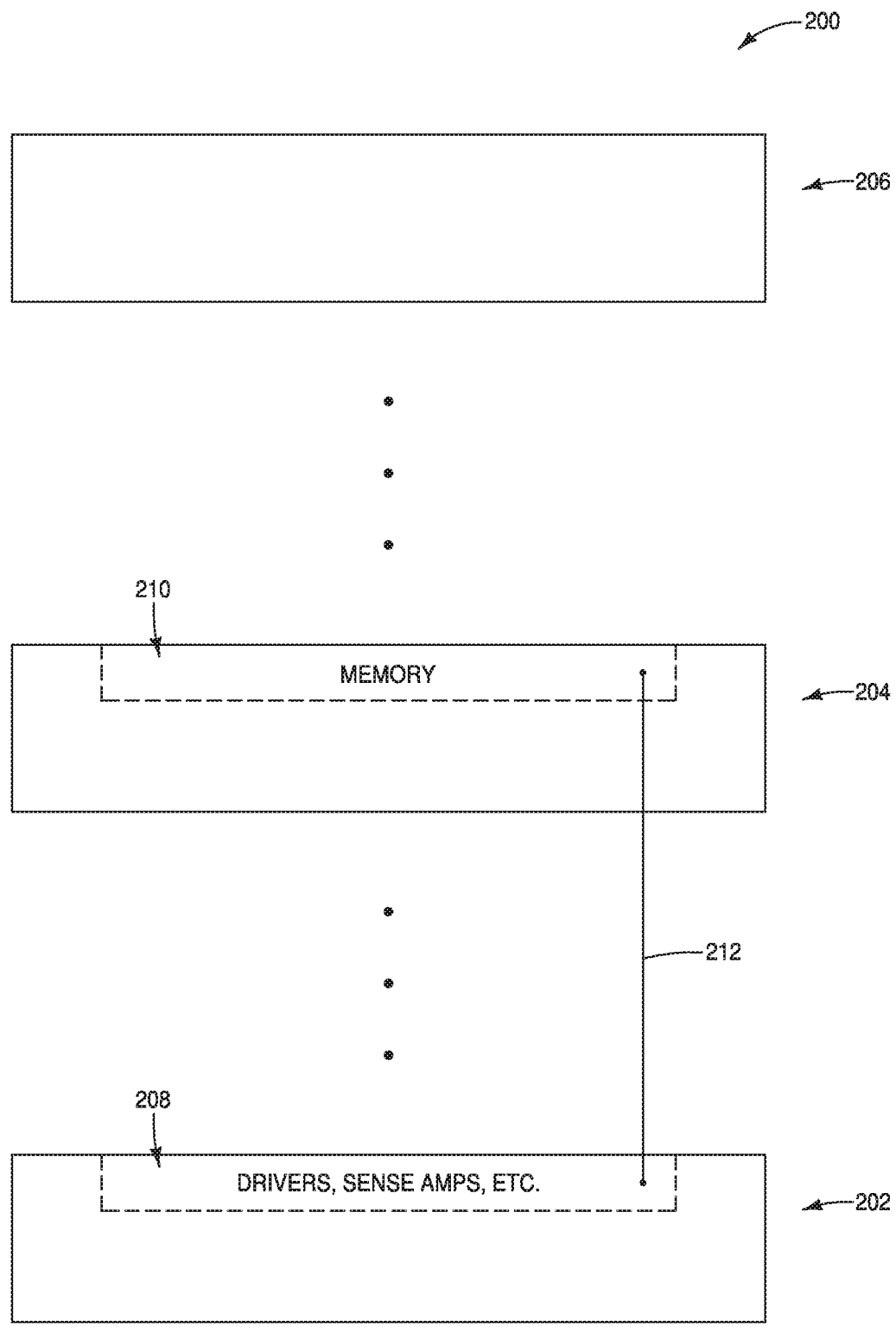
FIG. 16 is a diagrammatic cross-sectional side view of a region of an example multitier integrated assembly.

At least some of the circuitry 110, 112 and 116 may be directly under the memory arrays 106 in some embodiments. One or more of the circuitries 110, 112 and 116 may include CMOS, and accordingly some embodiments may include CMOS-under-array architecture. For instance, in some embodiments, the memory arrays 106 described herein may be within a memory tier (i.e., memory deck) which is within a vertically-stacked arrangement of tiers (or decks). The vertically-stacked arrangement may be referred to as a multitier assembly. FIG. 16 shows a portion of an example multitier assembly 200 comprising a vertically-stacked arrangement of tiers 202, 204 and 206. The vertically-stacked arrangement may extend upwardly to include additional tiers. The tiers 202, 204 and 206 may be considered to be examples of levels that are stacked one atop the other. The levels may be within different semiconductor dies, or at least two of the levels may be within the same semiconductor die.

The bottom tier 202 may include logic circuitry 208 which may comprise control circuitry and/or sensing circuitry (e.g., may include drivers, sense amplifiers, etc.). In some applications the logic circuitry may include CMOS circuitry. The upper tiers 204 and 206 may include memory arrays, such as, for example, the memory arrays 106 described above; with an example memory array being shown as "memory" 210 within the tier 204.

The circuitry from the upper tiers may be electrically connected to the circuitry of the lower tiers through electrical interconnects. An example electrical interconnect 212 is shown electrically coupling the memory circuitry 210 from the tier 204 with the circuitry 208 of the tier 202. In some embodiments, the interconnect 212 may connect digit lines from the memory circuitry 210 with sense amplifiers of the circuitry 208, may connect wordlines of the memory circuitry 210 with drivers of the circuitry 208, etc.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having laterally-spaced electrical nodes along a cross-section. Bottom electrodes are coupled with the electrical nodes. Each of the bottom electrodes has a first leg electrically coupled with an associated one of the electrical nodes, and has a second leg joining to the first leg. The second legs are substantially orthogonal to the first legs. A first set of the bottom electrodes has the first legs projecting from the second legs in a first direction along the cross-section. A second set of the bottom electrodes has the first legs projecting from the second legs in a second direction along the cross-section, with the second direction being opposite to the first direction. The bottom electrodes of the first set alternating with the bottom electrodes of the second set along the cross-section. First gaps are between the first legs of neighboring bottom electrodes. Second gaps are between the second legs of neighboring bottom electrodes. Vertically-stacked scaffold structures are within the second gaps and not within the first gaps. The vertically-stacked scaffold structures are vertically spaced from one another by intervening spaces. Insulative material is within the first gaps and along the first and second legs. A conductive-plate-material is over the insulative material and is spaced from the bottom electrodes by the insulative material. Capacitors include the bottom electrodes, regions of the insulative material and regions of the conductive-plate-material.

Some embodiments include an integrated assembly comprising a first electrical node laterally adjacent a second electrical node. A first conductive structure is electrically coupled with the first electrical node. The first conductive structure has a first substantially horizontal leg over the first electrical node, and has a first substantially vertical leg joining to the first substantially horizontal leg. The first substantially vertical leg has a first inner edge in opposing relation to the first substantially horizontal leg, and has a first outer edge directly above the first substantially horizontal leg. A second conductive structure is electrically coupled with the second electrical node. The second conductive structure has a second substantially horizontal leg over the second electrical node, and has a second substantially vertical leg joining to the second substantially horizontal leg. The second substantially vertical leg has a second inner edge in opposing relation to the second substantially horizontal leg, and has a second outer edge directly above the second substantially horizontal leg. The first and second inner edges face one another along a cross-section. A gap is between the first and second inner edges. Two or more scaffold layers are within the gap. Each of the scaffold layers directly contacts the first inner edge and directly contacts the second inner edge. The scaffold layers are vertically spaced from one another by intervening spaces. Insulative material is along the first and second outer edges and directly contacts the first and second outer edges and upper surfaces of the first and second substantially horizontal legs. A conductive-plate-material is adjacent to the insulative material and is spaced from the first and second conductive structures by the insulative material. A first capacitor comprises the first conductive structure, a first region of the insulative material and a first region of the conductive-plate-material. A second capacitor comprises the second conductive structure, a second region of the insulative material and a second region of the conductive-plate-material.

Some embodiments include a method of forming an integrated assembly. A construction is formed to comprise electrical nodes associated with upper source/drain regions of vertically-extending transistors. A stack is formed over the construction. The stack comprises alternating first and second levels. The first levels comprise a first sacrificial material and the second levels comprise scaffold material. The stack is patterned into rails. The rails extend along a first direction. First trenches are between the rails. Upper surfaces of the electrical nodes are exposed at bottoms of the first trenches. Bottom-electrode-material is formed within the first trenches. The bottom-electrode-material narrows the first trenches. Spacer material is formed within the narrowed first trenches. Second trenches are formed by removing every other one of the rails and removing the bottom-electrode-material along sidewalls of said every other one of the rails. A remaining configuration has beams extending along the first direction. Each of the beams comprises one of the remaining rails between a pair of angle plates patterned from the bottom-electrode-material, and comprises a pair of panels of the spacer material. The panels of the spacer material within the beams are spaced from the rails by the bottom-electrode-material of the angle plates. A second sacrificial material is formed within the second trenches. Third trenches are formed to extend along a second direction which crosses the first direction. The third trenches subdivide the beams into beam segments. The subdivided angle plates within the beam segments are bottom electrodes. Each of the bottom electrodes has a substantially vertical segment and a substantially horizontal segment, with the substantially horizontal segment being electrically coupled with an associated one of the electrical nodes. Each of the beam segments comprises a pair of the bottom electrodes and a rail segment between said pair of the bottom electrodes. The spacer material, first sacrificial material and second sacrificial material are removed, and then each of the beam segments comprises the pair of bottom electrodes and comprises vertically-spaced scaffold structures between the bottom electrodes of said pair, with said scaffold structures comprising the scaffold material. Insulative material is formed adjacent to the bottom electrodes. Conductive-plate-material is formed adjacent to the insulative material and is spaced from the bottom electrodes by the insulative material. The conductive-plate-material, insulative material and bottom electrodes together form capacitors.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   laterally-spaced electrical nodes along a cross-section;
   bottom electrodes coupled with the electrical nodes; each of the bottom electrodes having a first leg electrically coupled with an associated one of the electrical nodes, and having a second leg joining to the first leg; the second legs being substantially orthogonal to the first legs; a first set of the bottom electrodes having the first legs projecting from the second legs in a first direction along the cross-section; a second set of the bottom electrodes having the first legs projecting from the second legs in a second direction along the cross-section, with the second direction being opposite to the first direction; the bottom electrodes of the first set alternating with the bottom electrodes of the second set along the cross-section;
   first gaps between the first legs of neighboring bottom electrodes;
   second gaps between the second legs of neighboring bottom electrodes;
   vertically-stacked scaffold structures within the second gaps and not within the first gaps; the vertically-stacked scaffold structures being vertically spaced from one another by intervening spaces;
   insulative material within the first gaps and along the first and second legs;
   a conductive-plate-material over the insulative material and spaced from the bottom electrodes by the insulative material; and
   capacitors comprising the bottom electrodes, regions of the insulative material and regions of the conductive-plate-material.

2. The integrated assembly of claim 1 wherein the insulative material is non-ferroelectric.

3. The integrated assembly of claim 1 wherein the insulative material is ferroelectric.

4. The integrated assembly of claim 1 wherein the scaffold structures comprise silicon nitride.

5. The integrated assembly of claim 4 wherein the scaffold structures directly contact the second legs.

6. The integrated assembly of claim 5 wherein the insulative material is within the intervening spaces between the scaffold structures.

7. The integrated assembly of claim 6 wherein the conductive-plate-material is within the intervening spaces between the scaffold structures.

8. The integrated assembly of claim 1 wherein:
   the electrical nodes are associated with upper source/drain regions of transistors;
   the transistors have lower source/drain regions vertically offset from the upper source/drain regions; and
   the transistors have vertically-extending channel regions between the upper source/drain regions and the lower source/drain regions.

9. The integrated assembly of claim 1 wherein a memory array comprises memory cells containing the capacitors.

10. The integrated assembly of claim 9 wherein the memory array is a DRAM array.

11. The integrated assembly of claim 9 wherein the memory array is an FeRAM array.

12. An integrated assembly, comprising:
    a first electrical node laterally adjacent a second electrical node;

a first conductive structure electrically coupled with the first electrical node;
the first conductive structure having a first substantially horizontal leg over the first electrical node, and having a first substantially vertical leg joining to the first substantially horizontal leg; the first substantially vertical leg having a first inner edge in opposing relation to the first substantially horizontal leg, and having a first outer edge directly above the first substantially horizontal leg;
a second conductive structure electrically coupled with the second electrical node; the second conductive structure having a second substantially horizontal leg over the second electrical node, and having a second substantially vertical leg joining to the second substantially horizontal leg; the second substantially vertical leg having a second inner edge in opposing relation to the second substantially horizontal leg, and having a second outer edge directly above the second substantially horizontal leg;
the first and second inner edges facing one another along a cross-section;
a gap between the first and second inner edges;
two or more scaffold layers within the gap; each of the scaffold layers directly contacting the first inner edge and directly contacting the second inner edge; the scaffold layers being vertically spaced from one another by intervening spaces;
insulative material along the first and second outer edges and directly contacting the first and second outer edges and upper surfaces of the first and second substantially horizontal legs;
a conductive-plate-material adjacent the insulative material and spaced from the first and second conductive structures by the insulative material;
a first capacitor comprising the first conductive structure, a first region of the insulative material and a first region of the conductive-plate-material; and
a second capacitor comprising the second conductive structure, a second region of the insulative material and a second region of the conductive-plate-material.

13. The integrated assembly of claim 12 wherein the scaffold layers comprise silicon nitride.

14. The integrated assembly of claim 12 wherein the first and second capacitors are non-ferroelectric capacitors.

15. The integrated assembly of claim 12 wherein the first and second capacitors are ferroelectric capacitors.

16. The integrated assembly of claim 12 wherein the insulative material is within the intervening spaces between the scaffold layers.

17. The integrated assembly of claim 16 wherein the conductive-plate-material is within the intervening spaces between the scaffold layers.

18. The integrated assembly of claim 12 wherein:
the first electrical node is associated with a first upper source/drain region of a first transistor;
the second electrical node is associated with a second upper source/drain region of a second transistor;
a digit line is under the first and second transistors;
the first transistor has a first lower source/drain region electrically coupled with the digit line;
the second transistor has a second lower source/drain region electrically coupled with the digit line;
the first transistor has a first vertically-extending channel region between the first upper source/drain region and the first lower source/drain region; and
the second transistor has a second vertically-extending channel region between the second upper source/drain region and the second lower source/drain region.

19. The integrated assembly of claim 18 comprising:
a first wordline operatively adjacent the first channel region; and
a second wordline operatively adjacent the second channel region.

20. The integrated assembly of claim 19 wherein:
first and second memory cells of a memory array comprise the first and second capacitors, respectively;
logic circuitry is under the memory array and includes wordline-driver-circuitry and sense-amplifier-circuitry;
the digit line is coupled with the sense-amplifier-circuitry; and
the first and second wordlines are coupled with the wordline-driver-circuitry.

21. A method of forming an integrated assembly, comprising:
forming a construction comprising electrical nodes associated with upper source/drain regions of vertically-extending transistors;
forming a stack over the construction; the stack comprising alternating first and second levels; the first levels comprising a first sacrificial material and the second levels comprising scaffold material;
patterning the stack into rails; the rails extending along a first direction; first trenches being between the rails; upper surfaces of the electrical nodes being exposed at bottoms of the first trenches;
forming bottom-electrode-material within the first trenches, the bottom-electrode-material narrowing the first trenches;
forming spacer material within the narrowed first trenches;
forming second trenches by removing every other one of the rails and removing the bottom-electrode-material along sidewalls of said every other one of the rails;
a remaining configuration having beams extending along the first direction; each of the beams comprising one of the remaining rails between a pair of angle plates patterned from the bottom-electrode-material, and comprising a pair of panels of the spacer material; the panels of the spacer material within the beams being spaced from the rails by the bottom-electrode-material of the angle plates;
forming a second sacrificial material within the second trenches;
forming third trenches to extend along a second direction which crosses the first direction; the third trenches subdividing the beams into beam segments; the subdivided angle plates within the beam segments being bottom electrodes; each of the bottom electrodes having a substantially vertical segment and a substantially horizontal segment, with the substantially horizontal segment being electrically coupled with an associated one of the electrical nodes; each of the beam segments comprising a pair of the bottom electrodes and a rail segment between said pair of the bottom electrodes;
removing the spacer material, the first sacrificial material and the second sacrificial material; after said removing, each of the beam segments comprising the pair of bottom electrodes and comprising vertically-spaced scaffold structures between the bottom electrodes of said pair, with said scaffold structures comprising the scaffold material;

forming insulative material adjacent the bottom electrodes; and forming conductive-plate-material adjacent the insulative material and spaced from the bottom electrodes by the insulative material; the conductive-plate-material, insulative material and bottom electrodes together forming capacitors.

22. The method of claim 21 further comprising:

forming a protective strap across the beam segments prior to removing the spacer material, the first sacrificial material and the second sacrificial material; and the removing of the spacer material, the first sacrificial material and the second sacrificial material being conducted while the protective strap remains across the beam segments.

23. The method of claim 22 wherein the protective strap comprises a same composition as the scaffold material.

24. The method of claim 23 wherein said same composition comprises silicon nitride.

25. The method of claim 21 wherein the first and second sacrificial materials comprise a same composition as one another.

26. The method of claim 21 wherein the first and second sacrificial materials comprise different compositions relative to one another.

27. The method of claim 21 wherein the first and second sacrificial materials comprise one or both of silicon dioxide and carbon.

28. The method of claim 21 wherein the spacer material comprises one or both of silicon dioxide and carbon.

29. The method of claim 21 wherein the scaffold material consists of silicon nitride.

30. The method of claim 21 wherein the insulative material is non-ferroelectric.

31. The method of claim 21 wherein at least some of the insulative material is ferroelectric.

* * * * *